United States Patent
Miyazaki et al.

(10) Patent No.: US 7,304,001 B2
(45) Date of Patent: Dec. 4, 2007

(54) FABRICATION METHODS OF SEMICONDUCTOR INTEGRATED CIRCUIT DEVICE AND PHOTOMASK

(75) Inventors: Isao Miyazaki, Isesaki (JP); Yasushi Takeuchi, Kodaira (JP); Toshihiro Morii, Machida (JP); Koji Sekiguchi, Hinoda (JP); Yoshihiko Okamoto, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/224,375

(22) Filed: Aug. 21, 2002

(65) Prior Publication Data

US 2003/0056189 A1 Mar. 20, 2003

(30) Foreign Application Priority Data

Sep. 17, 2001 (JP) ............................. 2001-282069

(51) Int. Cl.
*H01L 21/31* (2006.01)

(52) U.S. Cl. .................... 438/758; 700/121; 716/19

(58) Field of Classification Search ............... 438/758, 438/756
See application file for complete search history.

(56) References Cited

FOREIGN PATENT DOCUMENTS

| JP | 6-332150 | 12/1994 |
|----|----------|---------|
| JP | 8-7003 | 1/1996 |
| JP | 11-184065 | 7/1999 |

OTHER PUBLICATIONS

Shigeo Shingo A Study of the Toyota Production From an Industrial Engineering Viewpoint Productivity Press 1981 (english translation 1989) pp. 4.26-27,90-91, 126, 176, 182-183.*
Yasuhiro Monden Toyota Production System Industrial Engineering and Management Press 1993 pp. 98-99.*
Shigeo Shingo A Study of the Toyota Production From an Industrial Engineering Viewpoint Productivity Press (1981 (English re-translation 1989) p. 104.*
Shigeo Shingo A Study of the Toyota Production From an Industrial Engineering Viewpoint Productivity Press (1981 (English re-translation 1989) pp. 87, 197,205,210.*
English language translation of JP11-184065 date of publication Jul. 9, 1999, Applicant: NEC CORP, "System and Method for Processing Mask Data and Storage Medium Where They Are Written".

* cited by examiner

*Primary Examiner*—Jack Chen
(74) *Attorney, Agent, or Firm*—Miles & Stockbridge P.C.

(57) ABSTRACT

Under the condition that a semiconductor maker and a photomask maker are separated but these are mutually connected with a communication line, the semiconductor maker gives a photomask fabrication schedule information to the photomask maker via the communication line, while the photomask maker fabricates the photomask depending on such fabrication schedule information and delivers the photomask to the semiconductor maker. The photomask maker periodically sends, in the course of fabrication process, a photomask fabrication progress information to the semiconductor maker via the communication line. The semiconductor maker regenerates the photomask fabrication schedule information depending on the photomask fabrication progress information sent from the photomask maker and then transfers the re-generated photomask fabrication schedule information to the photomask maker via the communication line. Therefore, mismatch between fabrication of semiconductor integrated circuit device and supply of photomask can be reduced or eliminated.

6 Claims, 22 Drawing Sheets

FIG. 8

(1) PROCESS COMPLETION MASTER FOR EACH PRODUCT (SK)

|  | DATA (1) | DATA (2) | DATA (3) | · · · · | DATA (κ) |
|---|---|---|---|---|---|
| PRODUCT NAME | HA001 | HA001 | HA001 |  | HA001 |
| PROCESS SEQUENCE | 1 | 2 | 3 |  | 5 |
| PHOTOMASK PROCESS NAME | L | M | O |  | Q |
| COMPLETION OF PRODUCT FABRICATION | 0:00 | 16:15 | 17:15 |  | 19:15 |

(2) PROCESS COMPLETION MASTER FOR EACH DELIVERY DESTINATION (NKK)

|  | DATA (1) | DATA (2) | DATA (3) | · · · · | DATA (κ) |
|---|---|---|---|---|---|
| NAME OF DELIVERY DESTINATION | D5 | N2 | 5M |  | Ci |
| COMPLETION OF MASK DELIVERY | 4:00 | 8:00 | 48:00 |  | 48:00 |

(3) PROCESS COMPLETION MASTER FOR EACH MASK SPECIFICATION (RSK)

|  | DATA (1) | DATA (2) | DATA (3) | · · · · | DATA (κ) |
|---|---|---|---|---|---|
| MASK SPECIFICATION | HALF-TONE | LEVENSON | 0.25 μm OR LESS |  | 0.35 μm OR LESS |
| COMPLETION OF MASK FABRICATION | 336:00 | 240:00 | 120:00 |  | 96:00 |

FIG. 17

| | MONITOR, NECESSARY/ UNNECESSARY | MONITORING PERIOD | MONITOR PREPARATION TIME |
|---|---|---|---|
| PROCESS START FAULT | NECESSARY | 1:00 | 2:00 |
| DELIVERY DATE FAULT | UNNECESSARY | 1:00 | 0 |

FIG. 18

```
FIRST ALARM
START
IF  PROCESS START FAULT MONITOR, NECESSARY/UNNECESSARY = UNNECESSARY  THEN  RETURN
IF  PROCESS START FAULT MONITOR END FLAG = END                        THEN  RETURN
IF  PRESENT TIME < (PROCESS START SCHEDULE TIME/MONITOR PREPARATION TIME) THEN RETURN

IF  PROCESS START RESULT = PRESENCE
    THEN  PROCESS START, NORMAL
    ELSE  PROCESS START FAULT ALARM
PROCESS START FAULT MONITOR END FLAG = END
RETURN
```

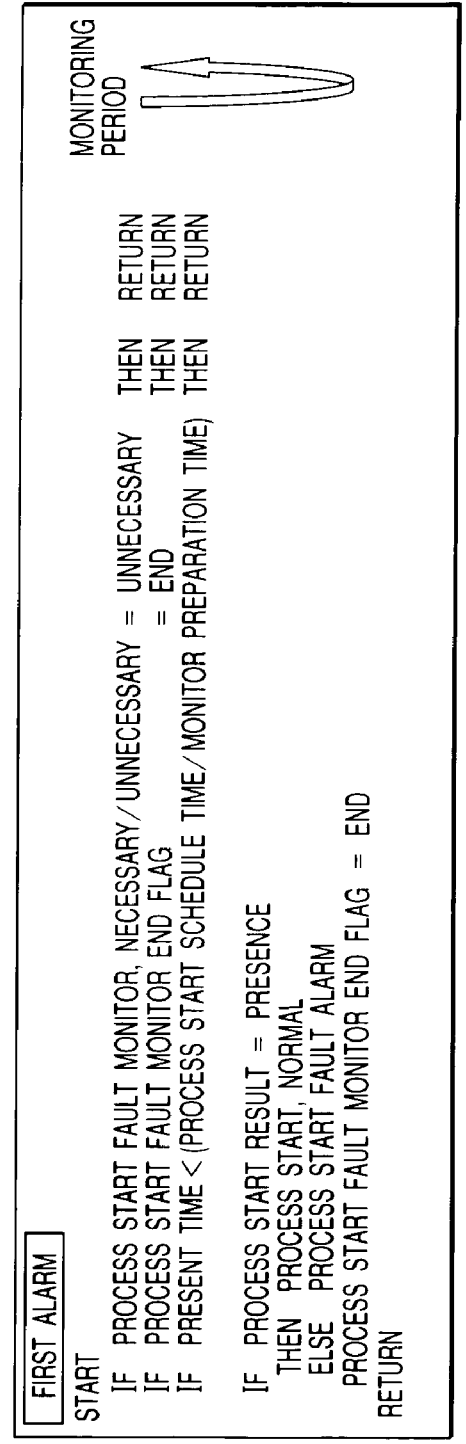

MONITORING PERIOD

FABRICATION METHODS OF SEMICONDUCTOR INTEGRATED CIRCUIT DEVICE AND PHOTOMASK

BACKGROUND OF THE INVENTION

The present invention relates to a fabrication technique of semiconductor integrated circuit device and a fabrication technique of photomask and particularly to a technique which may be effectively applied to a fabrication and management method of semiconductor integrated circuit device in such a case that a desired semiconductor integrated circuit device is fabricated through the closed inter-relation of respective fabrication processes between a semiconductor maker or fabrication department for fabricating semiconductor integrated circuit device (hereinafter referred to as only semiconductor maker) and a maker or fabrication department of photomask (hereinafter referred to as mask) (hereinafter referred to only as mask maker or the like).

According to a fabrication and management method of semiconductor integrated circuit device which has been discussed by the inventors of the present invention, the development and management departments of semiconductor makers or the like exchange communications, for example, through the telephone and facsimile networks to realize the supply of masks depending on the product development schedule for the purpose of production management of the desired semiconductor integrated circuit devices in the process that the mask makers or the like fabricate masks depending on the mask fabrication request ordered from design departments of semiconductor makers or the like and such masks are delivered to the fabrication lines of the semiconductor makers or the like.

For example, the Japanese Unexamined Patent Publication No. Hei 11(1999)-184065 discloses a technique to avoid increase of process time and number fabrication steps and generation of artificial mistake by generating a mask data, then automatically selecting a mask maker and then transferring the mask data to the mask maker. Moreover, the Japanese Unexamined Patent Publication No. Hei 6(1994)-332150 discloses automatic techniques for generation of mask data and inspection of mask. Moreover, the Japanese Unexamined Patent Publication No. Hei 8 (1996)-7003 discloses a management technique of mask and reticle.

SUMMARY OF THE INVENTION

However, the inventors of the present invention have found following problems in the technique for production management of the desired semiconductor integrated circuit device in which the development and management departments of semiconductor makers exchange communications, for example, through the telephone and facsimile networks to realize the supply of masks depending on the product development schedule.

Namely, the method explained above have following disadvantages, for example, that it is impossible to confirm the requested delivery date of mask is well matched with a flow of product (fabrication), mask cannot be supplied well in line with the flow of product (fabrication), it is impossible to accurately determine whether the mask is a cause of delay of delivery date (delay is resulting from preparation or fabrication of mask) or not, and sign of delay of delivery date of mask cannot be detected. Therefore, in the development stage of semiconductor integrated circuit device, a mismatch is generated between fabrication of semiconductor integrated circuit device and supply of the mask and thereby a delivery date obeying coefficient of mask cannot be improved, resulting in problems that improvement in the development rate of semiconductor integrated circuit device is interfered and expansion of share of mask fabrication maker is impeded. Particularly, considering the tendency for increase of masks to be prepared, increase of mask fabrication steps, external fabrication of mask and rise of mask price in the recent years, it is a very important problem how efficiently fabricate the semiconductor integrated circuit device within a short period of time by reducing or eliminating mismatch between the fabrication of semiconductor integrated circuit device and the supply of mask.

It is an object of the present invention to provide a technique to reduce or eliminate mismatching between fabrication of semiconductor integrated circuit device and supply of mask.

The aforementioned and other objects of the present invention and the novel features thereof may become apparent from the description of the present specification and the accompanying drawings.

Typical inventions of the present invention disclosed in the present specification are briefly explained as follows.

Namely, the present invention comprises the processes for assisting matching between fabrication of semiconductor integrated circuit device and mask through the use of communication lines.

Moreover, the present invention includes the process in which a photomask fabrication line for fabricating photomasks and a semiconductor fabrication line for transferring an integrated circuit pattern to a wafer with an exposure using the photomask are isolated with each other, photomask fabrication plan information required for fabrication of semiconductor integrated circuit device is given to the photomask fabrication line in the semiconductor device fabrication line side, while the photomask fabrication schedule information is received to determine the photomask process start sequence in the photomask fabrication line side.

BRIEF DESCRIPTION OF THE DRAWINGS

FIGS. 8(1), 8(2) and 8(3) are explanatory diagrams showing examples of master tables of the mask process start scheduler.

FIG. 17 is an explanatory diagram showing an example of a monitoring condition master used in the mask progress fault monitoring system of FIG. 16.

FIG. 18 is an explanatory diagram showing an example of a fault monitoring algorithm used in the mask progress-fault monitoring system of FIG. 16.

DETAILED DESCRIPTION OF THE PREFERRED EMBODIMENTS

Figure 1:
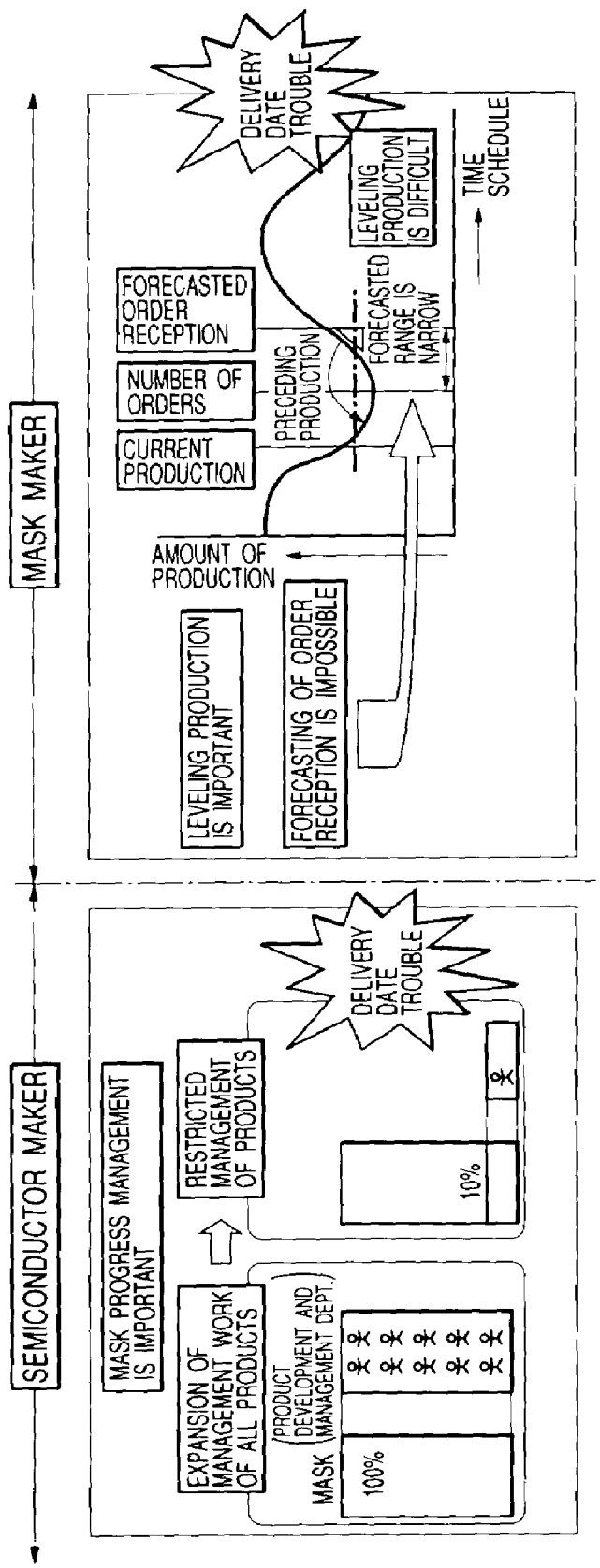
FIG. 1 is an explanatory diagram showing problems in a photomask progress management system and a photomask production system which the inventors of the present invention have discussed.

Before the present invention is explained in detail, the terms used in this specification will be explained first as follows.

1. Mask:

A mask expressed with a more significant concept including a reticle in which a pattern for shielding the light or a pattern for changing the phase of light is formed over a mask substrate. The area over the mask substrate includes an area over the mask substrate and an internal area or overlying area approximated to the upper surface of mask substrate (or may be disposed over the other mask substrate approximated to the upper surface). This mask includes an ordinary mask, a phase shift mask and a resist mask.

2. Ordinary Mask (Metal Mask or Chromium Mask):

This ordinary mask means a general mask in which a mask pattern is formed, comprising a light shielding metal pattern and a light transmitting pattern, over a mask substrate.

3. Phase Shift Mask:

This phase shift mask means a mask including a shifter for selectively inverting the phase of light for the mask substrate. The phase shift mask includes a Levenson type, a half-tone type and an edge-emphasis type phase shift masks.

4. Levenson Type Phase Shift Mask:

This phase shift mask is a kind of the phase shift mask for obtaining a more clear image through the interference effect by mutually inverting the phases of the adjacent apertures isolated by the light shielding regions.

5. Half-Tone Mask:

This mask is a kind of the phase shift mask including a half-tone shifter in which the transmitting coefficient of the half-tone film which works in common as a shifter and a light shielding film is 1% or higher but is under 40% (preferably, under 20%) and the phases of lights (in which a phase difference is reduced with each other with mutual interference (it is also allowed that the phase is not inverted perfectly, namely inverted imperfectly, in other words, it is allowed when the phases are at least not enhanced with each other)) are inverted with amount of phase shift when such transmitting coefficient is compared with that of the area where the half-tone film is not provided.

6. Resist Mask:

A resist mask used in the present invention is a kind of masks explained above in which a film based on a photosensitive resist is generally sensed and is patterned with a method using an electron beam (ion beam) or energy beam like the light (an ultraviolet ray such as vacuum ultraviolet, far ultraviolet, near ultraviolet ray and a visible light) or with a photolithography method. The light shielding film shields the entire part or a part of the ultraviolet ray such as vacuum ultraviolet ray, far ultraviolet ray and near ultraviolet ray and the visible light. The photosensitivity is an attribute of the resin itself explained above (however, if necessary, a light absorbing agent or a light scattering substance may be added) and an emulsion mask or the like of which photosensitivity is based on an additional substance such as silver halide does not correspond, as a rule, to the resist mask in the present invention. Namely, the resist mask used here does not have the desired light shielding property when it is developed but it already has the light shielding property before it is developed or when it is coated over the mask substrate. It is of course possible to say that the resist mask is allowed to include various additives including those explained above. In general, a resist includes an organic resin as the main resin element but it also allows addition of an inorganic substance.

7. Wafer:

A wafer means a silicon single crystal substrate (called a semiconductor wafer or a semiconductor integrated circuit wafer, in general, almost in the flat circular shape), a sapphire substrate, a glass substrate, another insulated or half-insulated semiconductor substrate and a composite substrate of these substrates used for fabrication of a semiconductor integrated circuit.

8. A semiconductor integrated circuit device (or an electronic device) includes not only a semiconductor integrated circuit device formed on the single crystal silicon substrate but also, although unless otherwise specified particularly, those formed on various substrates explained above and those formed on the other substrates such as SOI (Silicon On Insulator) substrate, substrate for fabrication of TFT (Thin Film Transistor) liquid crystal and substrate for fabrication of STN (Super Twisted Nematic) liquid crystal.

9. Mask fabrication schedule information (mask information) includes the entire information pieces or a plurality of information pieces selected from such entire information pieces of basic information such as name of mask, name of process and branch number, schedule information such as a mask process start schedule (process start schedule, delivery date schedule and fabrication period), fabrication information such as mask fabrication specification and difficulty of mask fabrication, process start schedule information of a semiconductor integrated circuit device using a mask and fabrication progress information for each fabrication process of a semiconductor integrated circuit device.

The following embodiments will be explained, when it is necessary, through division into a plurality of sections or other embodiments but, unless otherwise specified particularly, these divided sections of embodiments are not related with each other and one is only a part or entire part of the modification examples, detail explanation or complementary explanation of the other.

Moreover, when the number of elements or the like (including the quantity, numerical value, amount and range, etc.) will be explained in the following preferred embodiments, such number of elements is not restricted to the particular number, unless otherwise specified particularly and it may larger or smaller than the specified value.

Moreover, the structural elements (including the element steps or the like) is of course not always essential in the following embodiments, unless otherwise specified particularly and considered to be essential from the principle.

In the same manner, shape and positional relationship of the structural elements in the following embodiments shall include, unless otherwise specified particularly and not clearly considered to be from the principle, the shape which is substantially approximated or similar to the shape thereof. This is also true to the numerical value or range explained above.

In addition, the like elements having the like functions are designated with the like reference numerals throughout the drawings and the same explanation will not be repeated.

The preferred embodiments of the present invention will be explained in detail with reference to the accompanying drawings.

Embodiment 1

FIG. 1 illustrates a problem in mask progress management and mask production system discussed by the inventors of the present invention.

As explained above, for production of semiconductor integrated circuit device discussed by the inventors of the present invention, the development and management Dept. of a semiconductor maker executes the management for production of the desired semiconductor integrated circuit device by making communication among the makers, for example, using telephone system and facsimile network to realize supply of mask depending on the product development schedule. For preparation of mask, the necessary documents such as specifications, drawings, drawing data and order slip are processed separately. Moreover, various problems, for example, that it is not clear whether the requested delivery date of mask is well matched with the flow of products or not, mask cannot be supplied well in accordance with the flow of products, a cause of delay of mask from the delivery data cannot be judged accurately and a sign of delay of mask from the delivery date cannot be detected are also generated.

Moreover, the mask progress management in the semiconductor maker (left side in FIG. 1) requires a large amount of working steps to thoroughly execute the management of all products because the product development and management Dept. is executing the mask progress management by sending more persons in charge. Meanwhile, since the mask progress management is executed through limitation of products in order to reduce the workings steps in the actual execution of management, many troubles are also generated for the mask progress management in the products not in the management. On the other hand, the mask production system in the mask maker (right side of FIG. 1) is mainly considered for production of mask of which order is received and it is impossible from this mask production system to predict the order of mask to be received in future, making it difficult to provide a measure for the leveling production.

Particularly, in recent years, following four trends, (1) increase of number of masks to be prepared (36 thousands sheets/year), (2) increase of mask fabrication processes (up to 14 days from 2 days), (3) external fabrication of mask and (4) rise of mask price (up to ¥3,000,000 from ¥300,000), may be found in the industrial field for fabrication of semiconductor integrated circuit device. Therefore, in order to improve the mask delivery date obeying coefficient in the semiconductor maker, it is a very important factor how efficiently fabricate semiconductor integrated circuit devices by saving useless time, material, fuel and man-power.

Figure 2:
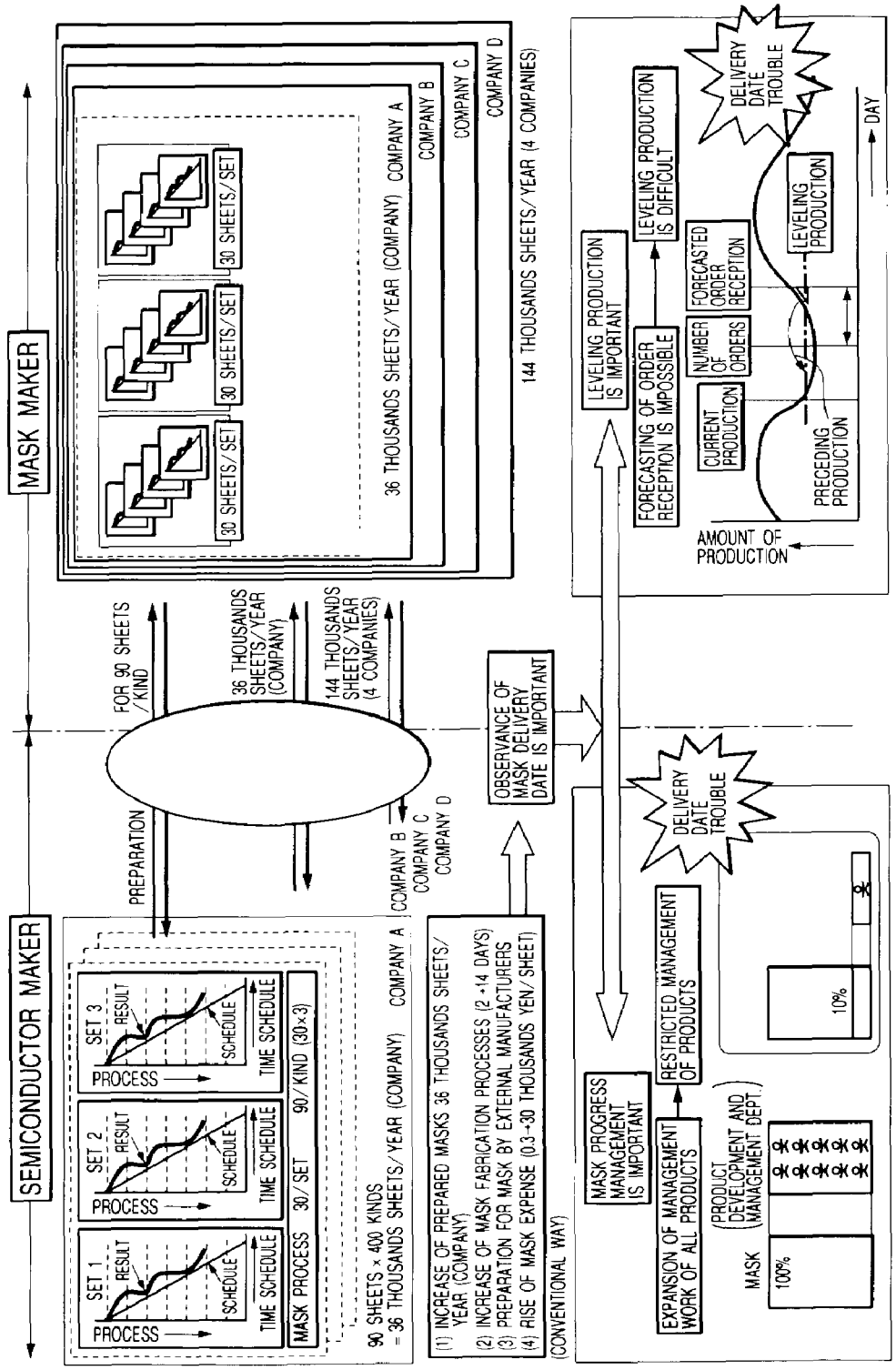
FIG. 2 is an explanatory diagram showing problems in photomask preparation and delivery date management which the inventors of the present invention have discussed.

FIG. 2 illustrates an example of the trend (1) listed above. A semiconductor maker usually prepares, for example, about 90 sheets of mask per product in the product development under the assumption that the mask is used in 30 processes for fabrication of a product and three sets of trial fabrication due to the change of mask is executed. A semiconductor maker annually issues the orders for 36 thousands sheets of mask to the mask makers under the assumption that 400 kinds of product are annually developed. Therefore, the total annual orders received from the semiconductor makers of four mask makers reach 144 thousands sheets. Therefore, in order to improve the mask delivery date obeying coefficient in the mask makers, it is a large problem for the mask makers how efficiently manufacture the masks as many as 144 thousands sheets within a year.

An example of the trend (2) will be explained as follows. In recent years, for fabrication of semiconductor integrated circuit device, a special mask such as phase shift mask, for example, is used in a certain case even for the mask in which elements and wirings are transferred to the wafer due to further progress in the scale-down of such elements and wirings. The phase shift mask requires longer times for fabrication than usual mask because a shifter is formed. In manufacture of semiconductor integrated circuit device, uses of such phase shift mask and usual mask are mixed within a series of manufacturing process. In this case, fabrication of semiconductor integrated circuit device and fabrication and delivery of mask are conducted in parallel in order to realize reduction of fabrication period, but when a process to use the special mask such as phase shift mask is included in a series of fabrication processes of the semiconductor integrated circuit device, the mask fabrication period cannot be determined to the constant period and the delivery data may be disturbed. Therefore, if fabrication of semiconductor integrated circuit device and fabrication and delivery of mask are not in the sufficient management, useless time may be generated and working processes may also be confused.

In regard to the trend (3), semiconductor integrated circuit devices and masks are fabricated in different companies from the viewpoint of technical and economical merits by the separated fabrication. In this case, disclosure of information and communication become more difficult than those when the semiconductor integrated circuit device and mask are fabricated by the same company. As a result, mismatching between the fabrication of semiconductor integrated circuit device and fabrication of mask becomes larger in some cases.

When the trend (4) is considered, the mask fabrication cost increases because of the actual situation that the mask for less number of times of use must be fabricated because the request for small amount of fabrication in multiple kind increases in addition to increase in the number of sheets of mask due to the increase of special mask such as phase shift mask and increase of fabrication processes of semiconductor integrated circuit device. Therefore, the mask progress management support and mask leveling production support are also necessary in order to solve various problems resulting from the trends (1) to (4).

Figure 3:
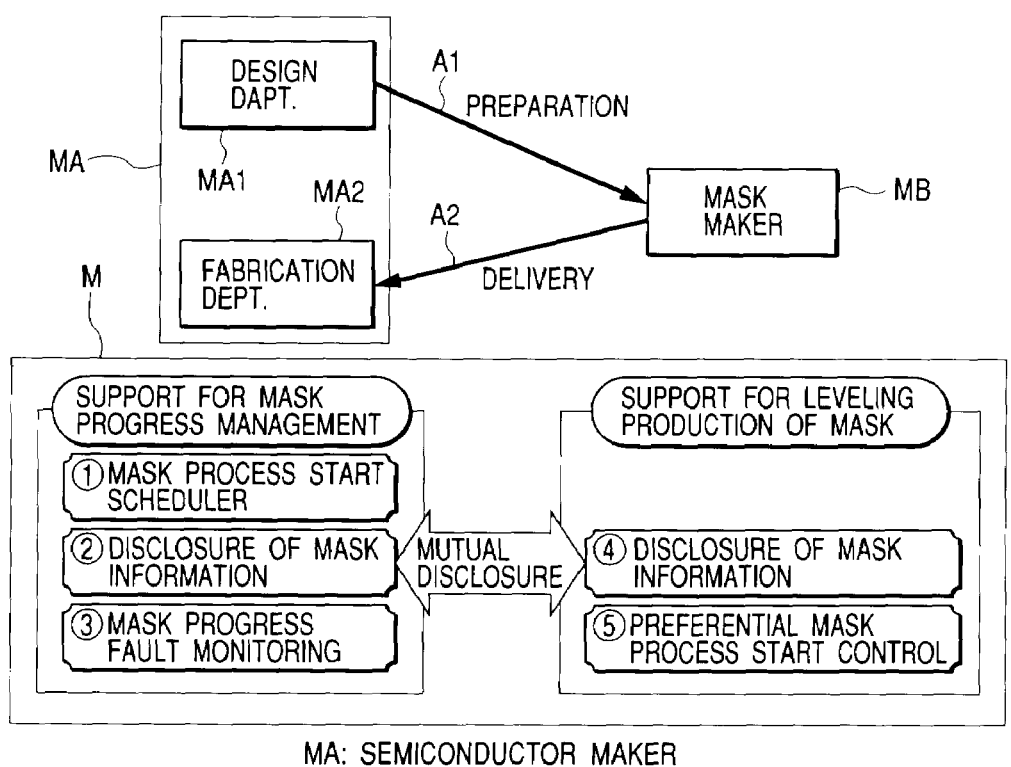
FIG. 3 is an explanatory diagram showing a photomask preparation system and a delivery date management system in the method of fabricating a semiconductor integrated circuit device as an embodiment of the present invention.

FIG. 3 illustrates a photomask preparation system and a delivery date management system in the method of fabricating a semiconductor integrated circuit device as an embodiment of the present invention.

In this example, a semiconductor maker (the semiconductor integrated circuit device fabrication line of the semiconductor integrated circuit device fabrication Dept.,) MA and a mask maker (the photomask fabrication line of the photomask fabrication Dept. MB are individually indicated. The semiconductor maker MA produces (including development and fabrication) semiconductor integrated circuit devices and the mask maker MB produces masks used for fabrication (exposing process) of the semiconductor integrated circuit devices.

These semiconductor maker MA and mask maker MB are physically separated but are connected in such a condition as enabling communication with each other through the communication line such as telephone line, facsimile system or Internet (or leased line). Particularly, for the mask maker MB which has agreed the fabrication contract to the semiconductor maker MA, an access right is previously set and the intrinsic identification number (ID), password and address are given to receive the support for matching by making access to the server of the semiconductor maker MA through the Internet (or leased line).

The Design Dept. MA1 of the semiconductor maker MA sends an order for fabrication of the desired mask to the mask maker MB. Namely, this Design Dept. MA1 offers process start request information (arrow mark A1). The mask-maker MB fabricates the desired mask depending on the request from the semiconductor maker MA and delivers the fabricated mask to the Fabrication Dept. MA2 of the semiconductor maker MA (arrow mark A2) In this embodiment, a matching support means M for supporting matching between fabrication of semiconductor integrated circuit device and fabrication of mask is provided in this process. This matching support means M comprises a mask progress management support means M1 and a mask leveling fabrication support means M2.

The mask progress management support means Ml is mainly offered from the semiconductor maker side and includes at least one of the (1) mask process start scheduler, (2) mask information mutual disclosing (mask process start schedule disclosing and mask process start result acquiring) function and (3) mask progress fault monitoring function for supporting the mask progress management. The mask leveling fabrication support means M2 is mainly offered from the mask maker side and includes at least one of the (1) mask information mutual disclosing (mask process start result) function and (2) preferential mask process start control function.

Figure 4:
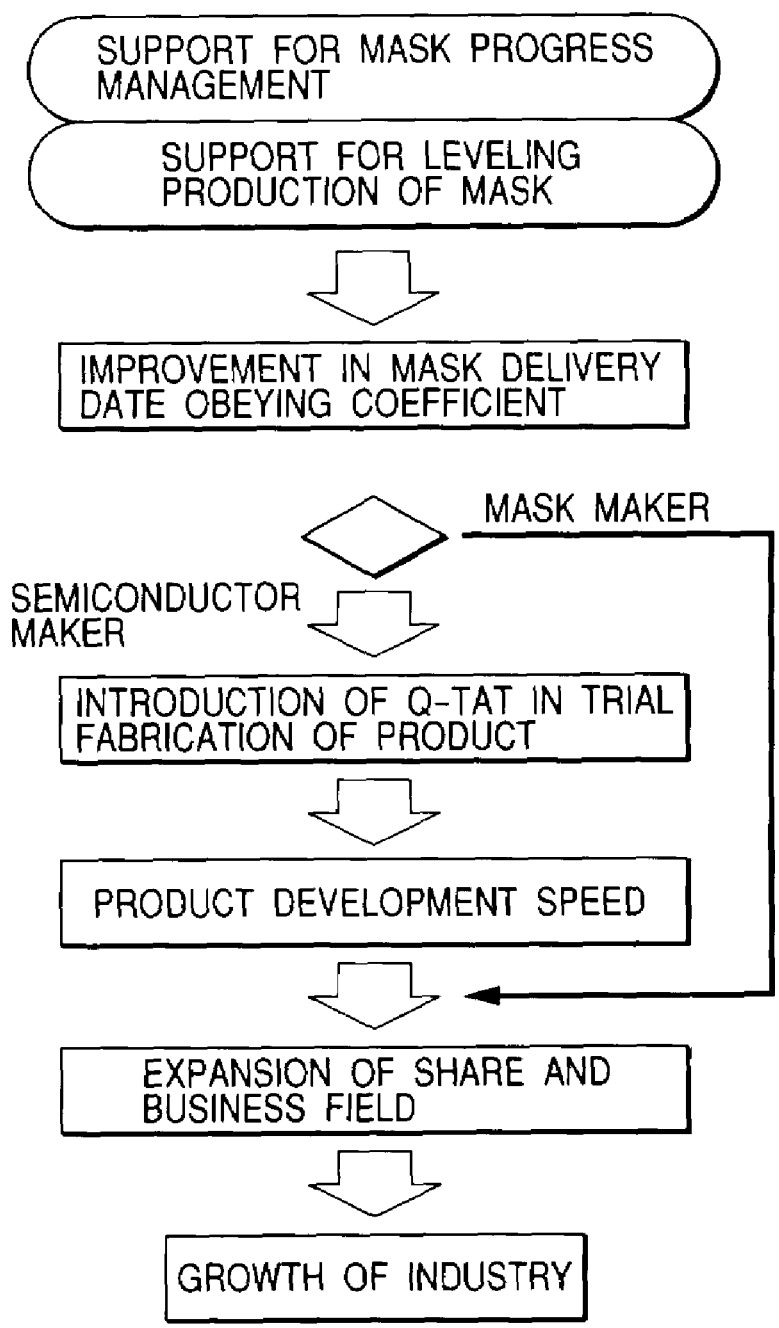
FIG. 4 is an explanatory diagram for showing effects of the method of FIG. 1.

FIG. 4 illustrates a profile and effects of this embodiment. According to the profile of this embodiment, it is possible to support the mask progress management and mask leveling fabrication and the mask delivery date obeying coefficient can be improved because mismatch between fabrication of semiconductor integrated circuit device and fabrication of mask can be lowered or eliminated. Therefore, the mask maker can expand the share and scope of business, while the semiconductor maker can also expand the share and scope of business through improvement in the product development speed (Q-TAT: Quick Turn Around Time). Therefore, both semiconductor maker and mask maker can make much contribution to development of industrial field. Here, mask progress management means the management of progress of mask fabrication (as scheduled, leading or delayed) until a plurality of masks used in a series of fabrication processes of the semiconductor integrated circuit device are fabricated and these masks are delivered to the semiconductor maker. Moreover, the leveling fabrication of mask means fabrication of masks not to generate fluctuation of delivery date or fabrication thereof with less fluctuation of delivery date.

Figure 5:
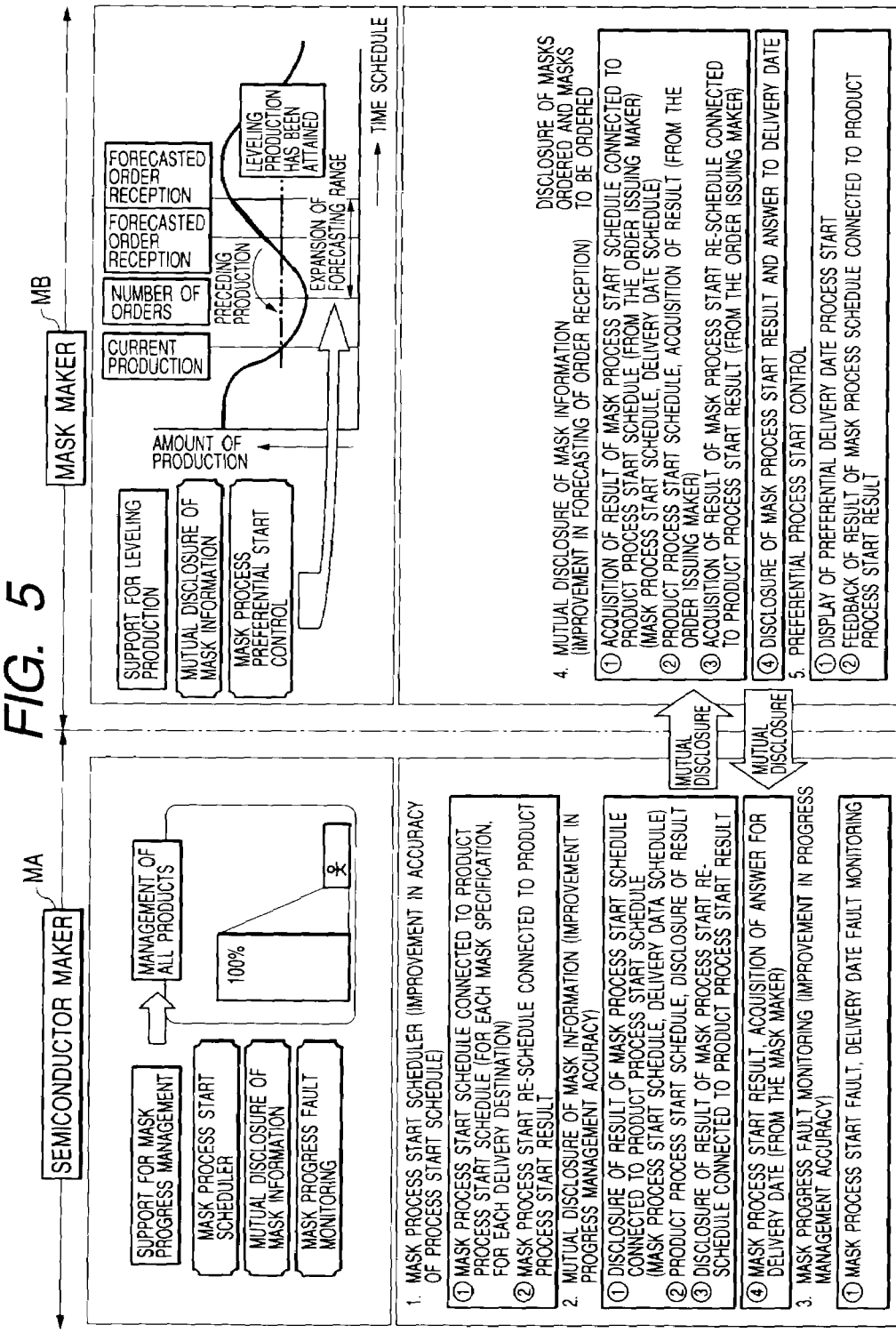
FIG. 5 is a detail explanatory diagram showing the mask preparation method and mask delivery date management system in the method of fabricating semiconductor integrated circuit device of FIG. 3.

FIG. 5 illustrates details of the mask preparation method and mask delivery date management system of FIG. 3.

The left side of FIG. 5 illustrates a mask progress management support. The mask process start scheduler includes a mask process start scheduler connected to product process start schedule and a mask process start re-scheduler connected to product process start result. This scheduler can generate the mask process start scheduler for each mask specification and delivery destination based on the product process start schedule and result. Here, the item of each delivery destination is used because the mask transfer time is different depending on the delivery destination.

Mutual disclosure of mask information given to the mask maker includes three contents of the mask process start schedule result connected to product process start schedule, the product process start schedule and result and the mask process start re-schedule connected to product process start result. The mask maker achieves the leveling fabrication by predicting order reception using this mask information.

The mask progress fault monitoring process includes a mask process start fault monitoring process and a mask delivery date fault monitoring process.

Meanwhile, the right side of FIG. 5 illustrates a mask leveling fabrication support. Here, the mutual disclosure of mask information includes three contents of acquisition of the mask process start schedule result connected to product process start schedule (for each mask specification and delivery destination), the product process start schedule and result and the mask process start re-schedule result connected to product process start result. The mask fabrication schedule information obtained here includes the mask information of the order to be received next as well as the mask information of the order already received and therefore this information can be used to easily expand the scope of the prediction of order reception and provide a measure for the leveling fabrication. Moreover, the mask process start result and answer to delivery date are also a part of the mask information given to the semiconductor maker. The semiconductor maker uses this information for progress management and fault monitor.

Here, the control for preferential process start includes display of preferential process start and feedback of the mask process start re-schedule result connected to product process start result.

Figure 6:
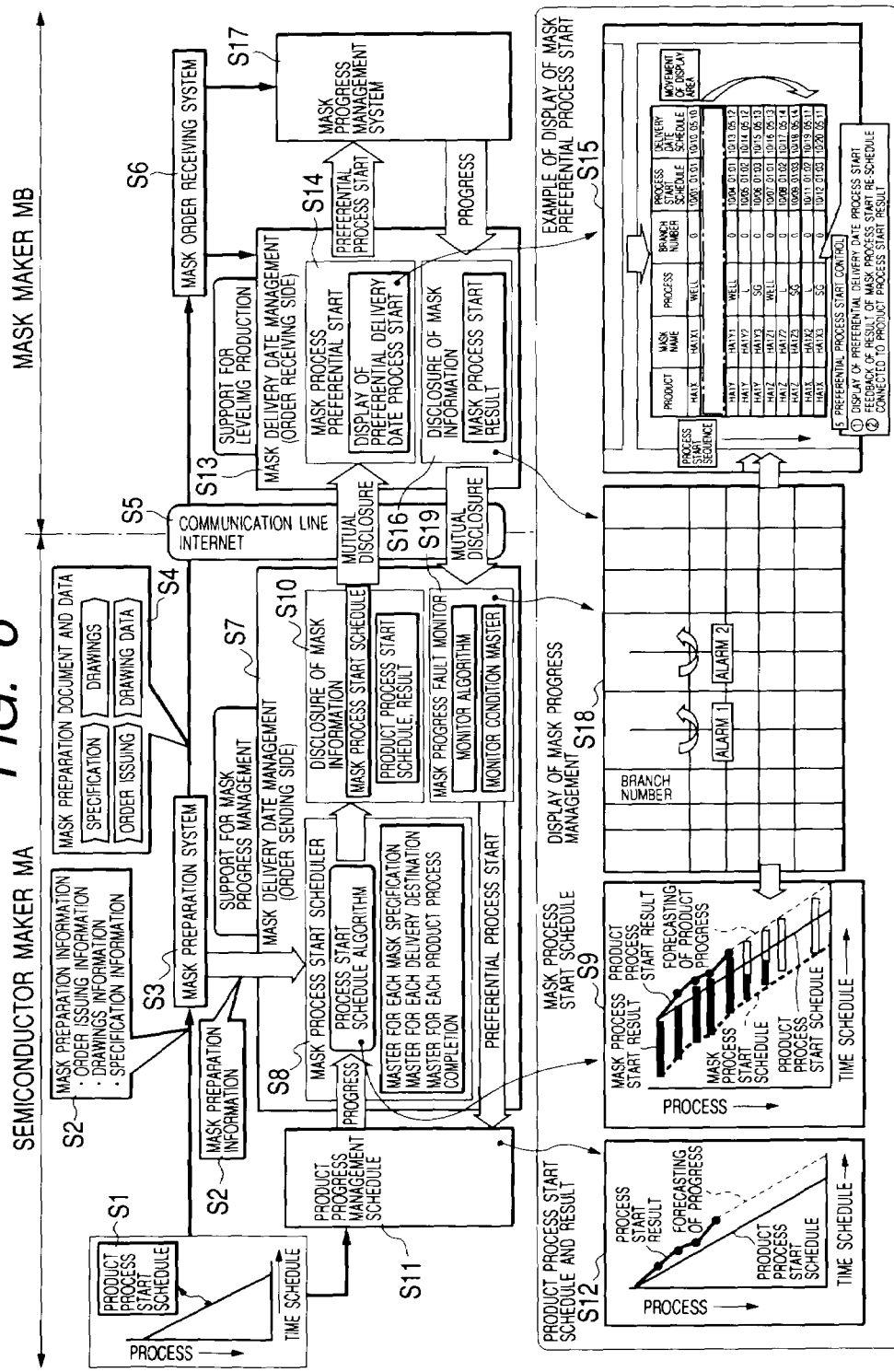
FIG. 6 is an explanatory diagram showing the basic structure of the mask preparation method and mask delivery data management system in the method of fabricating semiconductor integrated circuit device of FIG. 3.

FIG. 6 illustrates the basic structure of the mask preparation method and mask delivery data management system of FIG. 3.

First, the semiconductor maker MA asks preparation of masks to the mask maker MB by inputting mask preparation information S2, conforming to the product process start schedule S1, to the mask preparation system S3 using an input means such as a keyboard. The mask preparation information S2 includes, for example, order issuing information, drawing information and specification information or the like. Subsequently, the mask preparation system S3 converts the mask preparation information S2 to a mask preparation document & data S4 to transfer, via the communication line S6 like the Internet, to the mask order receiving system S6 of the mask maker MB and also to the mask process start scheduler S8 of the mask delivery date management S7 in the order sending side.

Next, the mask process start scheduler S8 generates a mask process start schedule (fabrication schedule information) S9 from the mask preparation information S2 using the previously registered mask specification master, delivery destination master and product process completion master and then discloses the mask process start schedule S9 (mask process start schedule & disclosing process connected to product process start schedule) to the mask maker MB via the first mask information disclosure S10 and the communication line 5. Thereby, a mask preparation mistake can be reduced. Moreover, the mask can be fabricated in line with the product fabrication progress.

Next, the mask process start scheduler S8 acquires periodically (for example, almost in every hour) a product progress result S12 from a product progress management system S11 and reschedules the mask process start schedule S9 connected to the product progress result and discloses this schedule, together with the product process start schedule and result, to the mask maker MB via the first mask information disclosure S10 and communication line S5. A product progress result S12 displays three elements of product process start schedule, process start result and prediction of progress using a graph (mask process start re-schedule connected to product result & disclosing process).

Next, a mask preferential process start S14 of the mask delivery date management S13 in the order receiving side executes the preferential process start display S15 based on the disclosed mask process start schedule S9. The mask maker MB starts the mask process depending on the preferential process start display (mask preferential-process start process). Thereby, useless time is no longer generated and the necessary mask can be fabricated when it is required and can be offered in the good timing to the semiconductor maker MA.

Next, a second mask information disclosure S16 of the mask delivery date management S13 in the order receiving side acquires a mask progress result S12 from the mask progress management system S17 and discloses this mask progress result S12 to the semiconductor maker MA (mask progress result disclosing process) via the communication line S5 with a method (mask progress management display S18) of comparison with the mask process schedule S9.

Next, a mask progress fault monitor S19 monitors a mask progress fault using a monitoring condition master based on the mask process start schedule S9 and the mask progress result obtained. When it is found as a result of this mask progress fault monitor that the mask progress result is leading the process start schedule, the result is fed back to the product progress management system S11 to advance the product process start. If the mask progress result is delayed from the process start schedule, follow-up to the mask maker MB and instruction for adjustment of product process start are fed back to the product progress management system S11 (mask progress fault monitor). That is, since the total flow of both fabrication of semiconductor integrated circuit device and fabrication of mask can be detected accurately in a series of fabrication processes of semiconductor integrated circuit device, matching or mismatching between fabrication of semiconductor integrated circuit device and fabrication of mask can be judged accurately. Moreover, a sign for delay in the supply of mask can be detected, adjustment or follow-up to prevent such delay can be realized in the stage where such delay is to be generated and thereby mismatch between fabrication of semiconductor integrated circuit device and fabrication of mask can be reduced or eliminated. In addition, since a reason for delay of mask (resulting from mask preparation or fabrication of mask, etc.) can be judged accurately, an effective measure for preventing such delay can surely be provided.

The semiconductor maker MA and mask maker MB can disclose the information with each other only by providing the information to both makers. The disclosed information can be displayed with a display means such as displays in the semiconductor maker MA and mask maker Mb.

Figure 7:
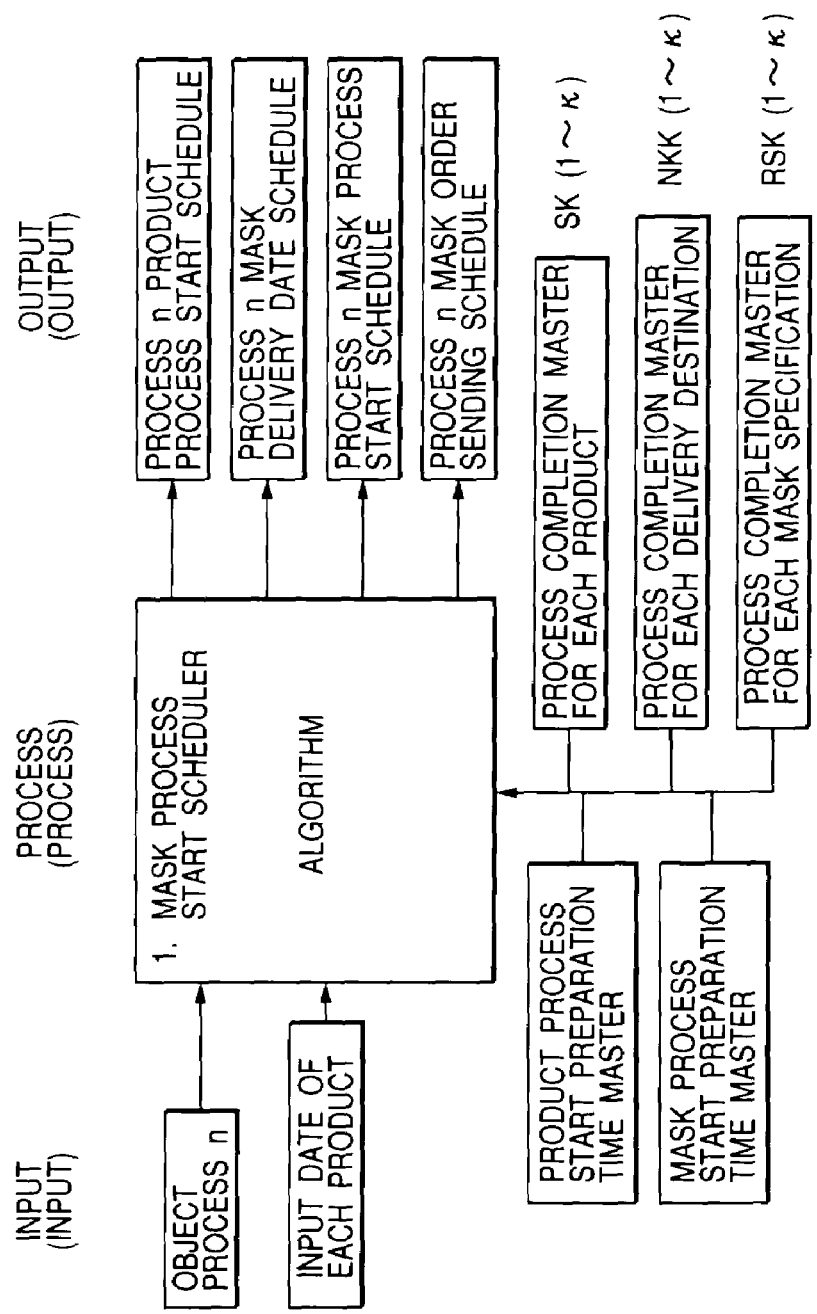
FIG. 7 is an explanatory diagram showing a system configuration of a mask process start scheduler of FIG. 6.
Figure 9:
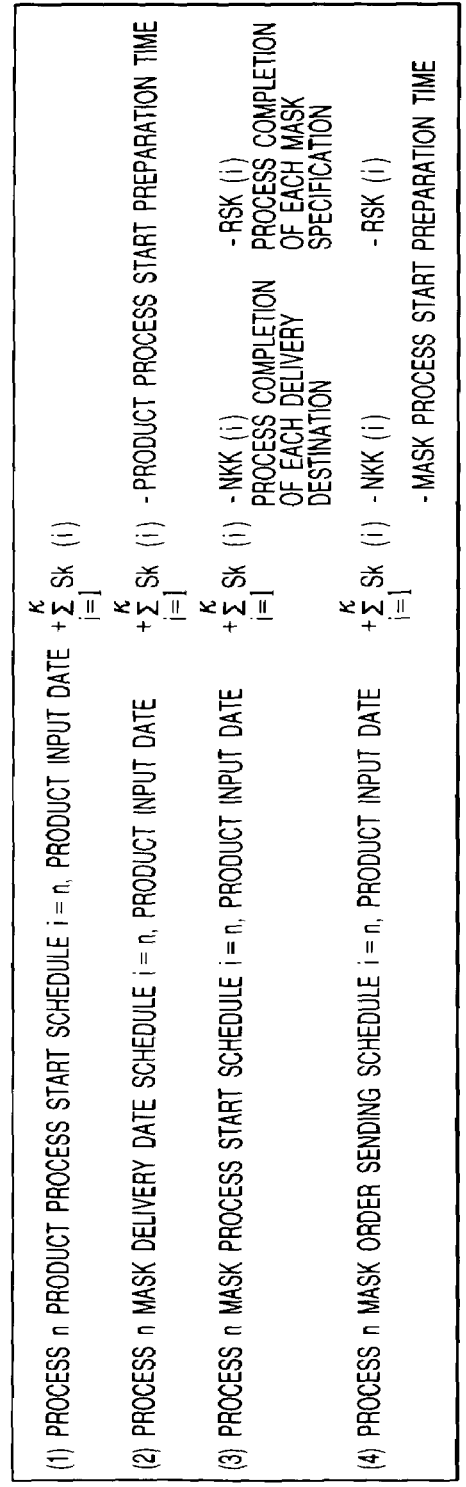
FIG. 9 is an explanatory diagram showing an example of algorithm of the mask process start scheduler.
Figure 10:
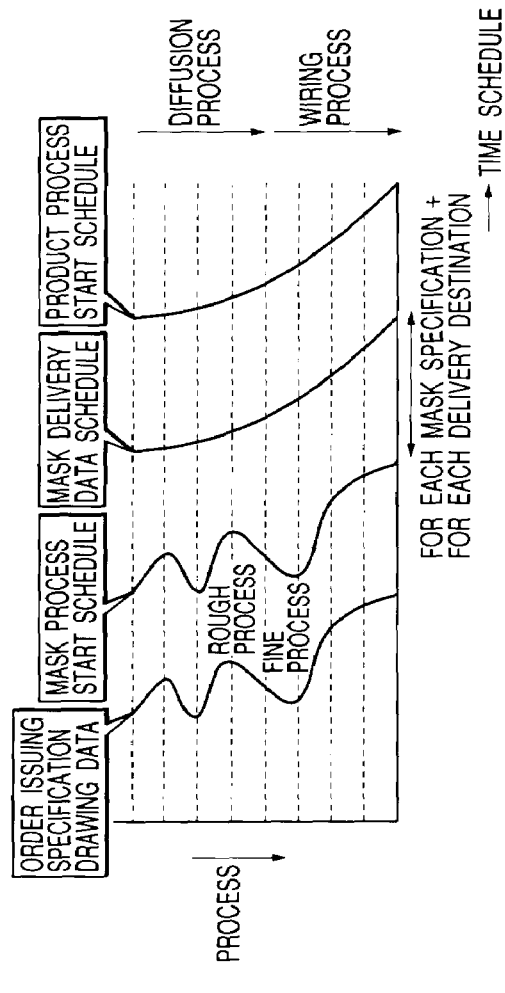
FIG. 10 is an explanatory diagram showing a basic example of schedule of the mask process start scheduler.

Next, the mask process start scheduler will be explained with reference to FIG. 7 to FIG. 10. FIG. 7 illustrates a system structure of the mask process start scheduler. FIGS. 8(1), 8(2) and 8(3) respectively illustrate an example of the master tables of the mask process start scheduler. FIG. 9 illustrates an example of algorithm of the mask process start scheduler. FIG. 10 illustrates a basic example of schedule of the mask process start scheduler.

A product input date and an object process n are inputted to the mask process start scheduler. The object process n means the process in the semiconductor integrated circuit device fabrication process where the mask is used. The mask process start scheduler generates a schedule depending on the algorithm of the mask process start scheduler of FIG. 9 based on the previously registered product process start preparation time master, mask process start preparation time master, product process completion master (SK), delivery destination process completion master (NKK) and mask specification process completion master (RSK).

As a result, the schedule including the product process start schedule of the object process n of FIG. 10, mask delivery date schedule, mask process start schedule and mask order sending schedule is outputted automatically. The horizontal axis of FIG. 10 indicates a date schedule and the vertical axis, the object processes (fabrication processes of semiconductor integrated circuit device (for example, diffusion process, subsequent wiring process)). The rough process means the process which may be completed with a comparatively lower pattern transfer accuracy, while the fine process means the process which may be completed with a comparatively higher pattern transfer accuracy. Since the period up to the mask delivery date schedule from the mask process start schedule will change depending on difference of mask specifications and delivery destinations, the schedule can be generated depending on such mask specifications and delivery destination.

Next, the first mask information mutual disclosure (disclosure of mask process start schedule connected to product process start schedule) will be explained with reference to FIG. 11 and FIG. 12.

Figure 11:
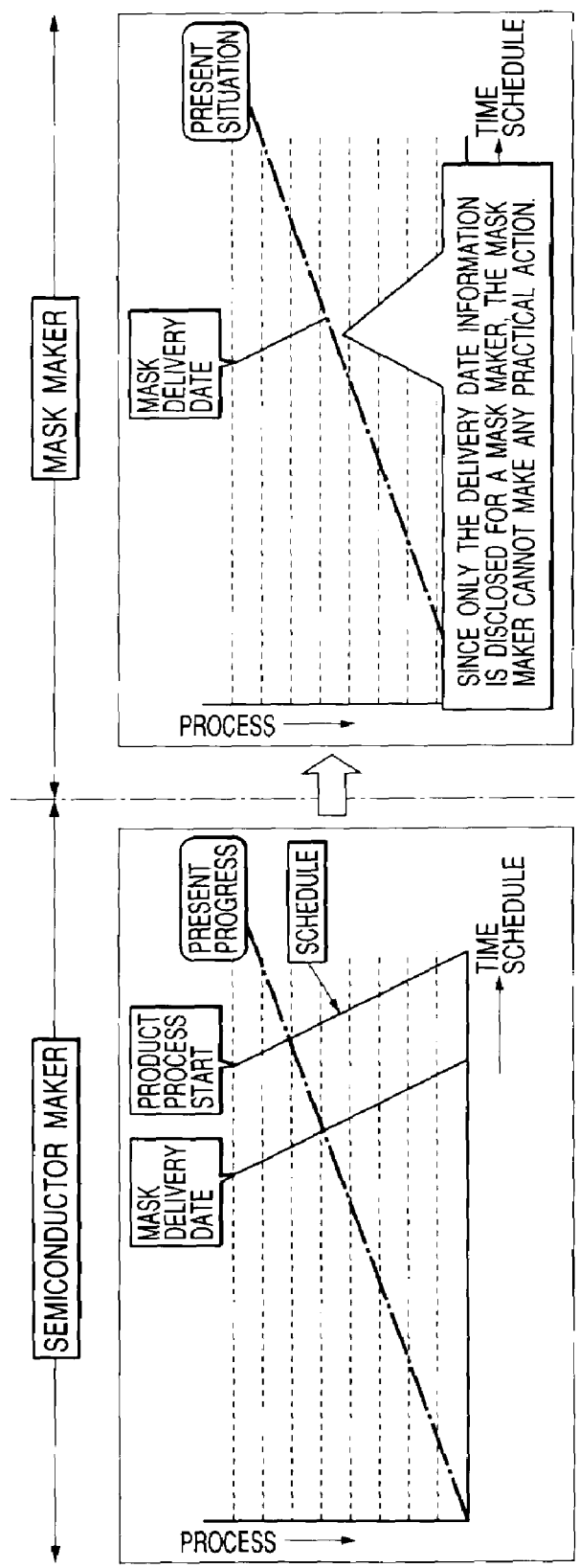
FIG. 11 is an explanatory diagram showing the mask process start schedule (left side) and mask information disclosure range (right side) for the comparison purpose which the inventors of the present invention have discussed.

FIG. 11 illustrates a mask process start schedule (left side of FIG. 11) and a mask information disclosure range (right side of FIG. 11) for the comparison purpose. Since only the delivery date information of the ordered mask is included in the information disclosed for the mask maker from the semiconductor maker, order reception cannot be predicted and thereby the leveling fabrication in the mask maker is very difficult.

Figure 12:
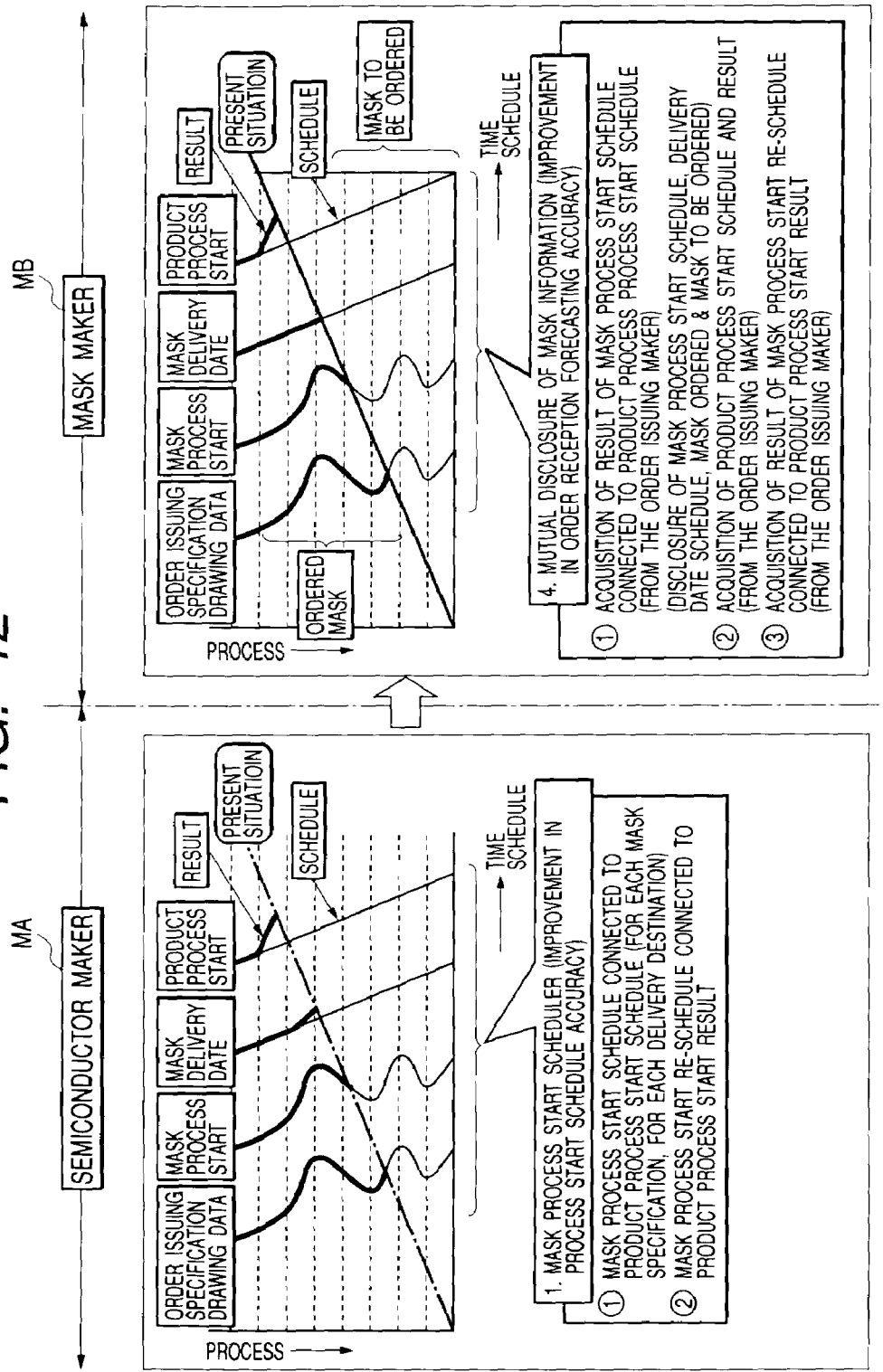
FIG. 12 is an explanatory diagram showing the mask process start schedule (left side) and the mask information disclosure range (right side) in-the method of fabricating semiconductor integrated circuit device as a preferred embodiment of the present invention.

FIG. 12 illustrates a mask process start schedule (left side of FIG. 12) and the mask information disclosure range (right side of FIG. 12) in the profile of this embodiment. The first mask information disclosure to the mask maker MB from the semiconductor maker in this embodiment newly includes, in addition to the delivery date information of ordered masks, a product process start schedule, a product process start result, a mask delivery date schedule, a mask process start schedule and a mask order schedule. Moreover, in this mask information disclosure, the information of the mask which is not ordered to the mask maker but will be ordered in future is also provided in addition to the information of mask ordered to the mask maker MA. Therefore, the mask maker can easily expand the range for prediction of order reception and thereby easily generates a mask fabrication schedule to easily provide a measure for leveling fabrication of mask. Accordingly, mismatching between fabrication of semiconductor integrated circuit device and fabrication of mask can be reduced or eliminated. As a result, useless time can be eliminated and the development period of the semiconductor integrated circuit device can be shortened remarkably. Moreover, fabrication cost of semiconductor integrated circuit device can also be reduced because a large amount of working processes are not required for management in fabrication of product.

Such mask information pieces disclosed in the embodiment are all output result of the mask process start scheduler and it is impossible to wide the range of mask information disclosure without such mask process start scheduler.

Figure 13:
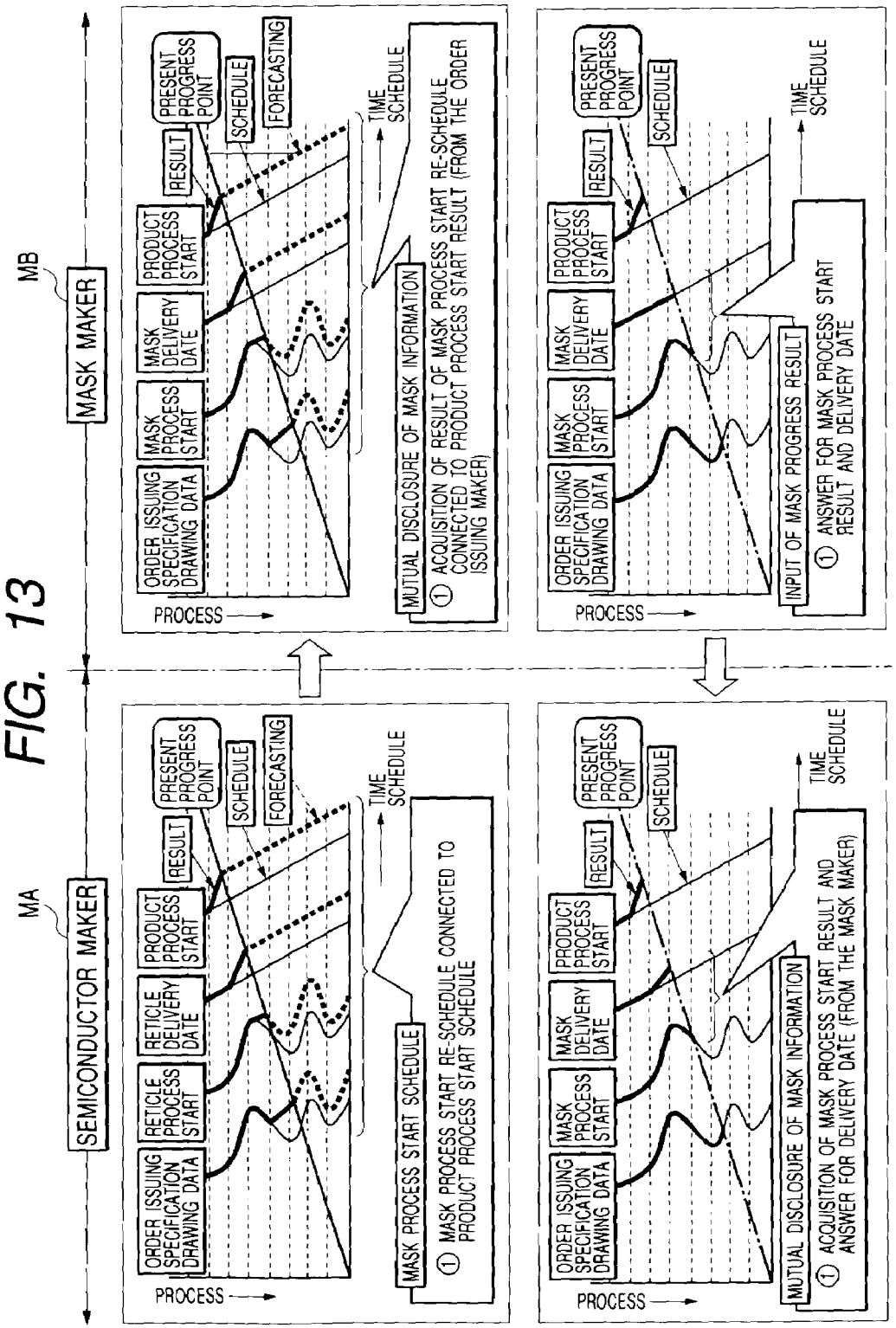
FIG. 13 is an explanatory diagram showing mask process start re-schedule disclosure connected to product process start result and mask process start result disclosure in the method of fabricating semiconductor integrated circuit device as the preferred embodiment of the present invention.

Next, the second mutual disclosure of mask information (disclosure of mask process start reschedule connected to product process start result) will be explained with reference to FIG. 13. FIG. 13 is an explanatory diagram of the mask process start reschedule disclosure connected to product process start result and mask process start result disclosure of this embodiment.

In this embodiment, the mask information disclosure to the mask maker MB from the semiconductor maker MA (left side in the upper side of FIG. 13) includes the product process start schedule, product process start result, mask delivery date schedule, mask process start schedule and mask order schedule. The mask process start scheduler periodically acquires (for example, about in every hour) the product progress result from the product progress management system, re-schedules the mask process start schedule connected to the product progress result and feeds back the result to the disclosed mask information in order to provide the mask process start schedule connected to the product process start result on the realtime basis (right side in the upper stage of FIG. 13).

The mask information disclosure to the semiconductor maker MA from the mask maker MB in this embodiment (right side of the lower stage of FIG. 13) includes, for example, the mask process start result and mask delivery date answer. Using this disclosed mask information, the mask progress management and mask progress fault monitor can be executed. The mask process start result and mask delivery date answer are inputted manually in the mask maker MB or automatically acquired from the mask progress management system (left side of the lower side of FIG. 13).

Figure 14:
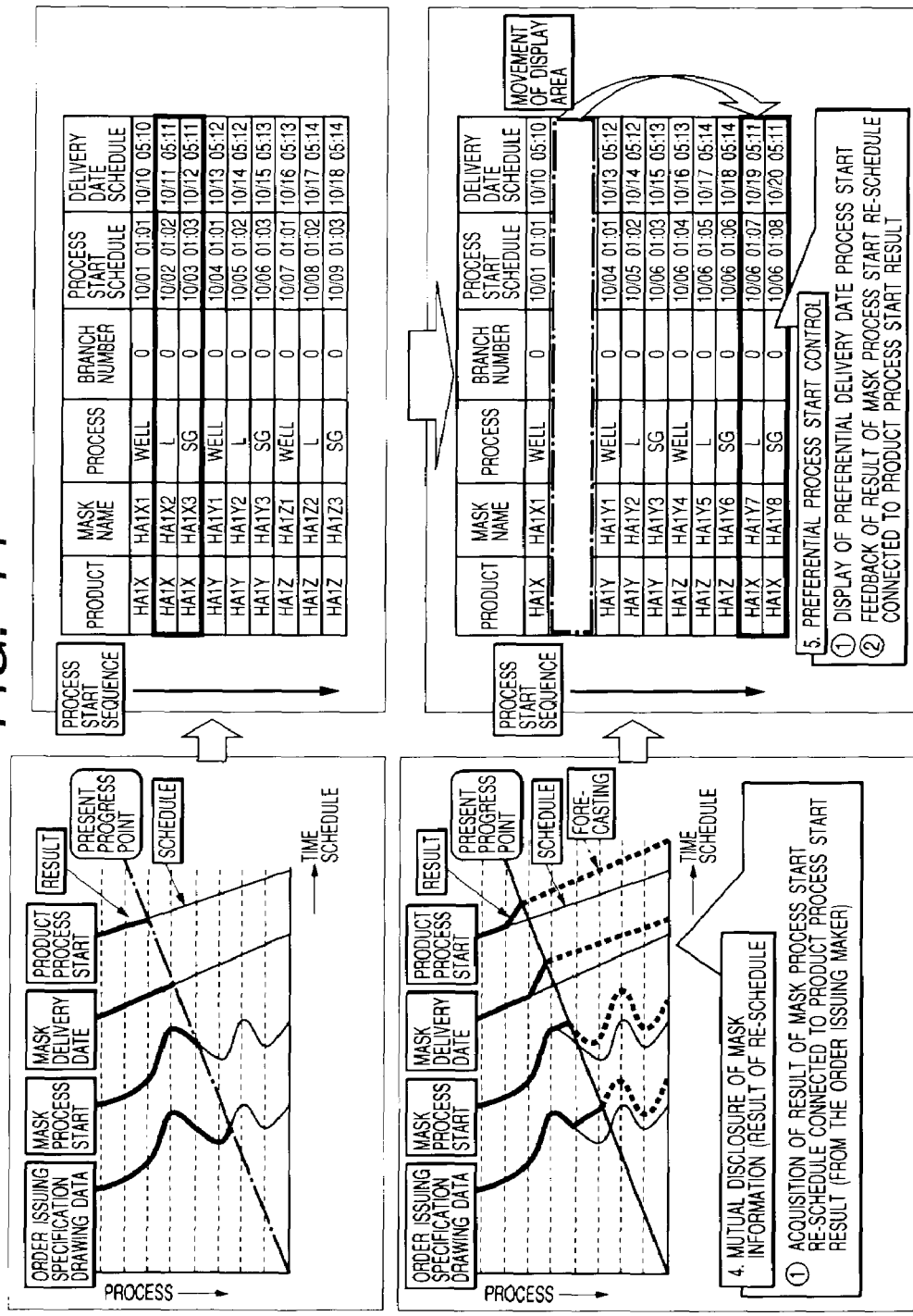
FIG. 14 is an explanatory diagram of mask process preferential start control in the method of fabricating semiconductor integrated circuit device as the preferred embodiment of the present invention.

Next, the mask preferential process start control will be explained with reference to FIG. 14. FIG. 14 is an explanatory diagram of the mask preferential process start control.

The left side of the upper stage of FIG. 14 illustrates the process start schedule connected to product process start schedule. In the mask maker MB, the preferential process start display as illustrated in the right side of the upper stage of FIG. 14 is conducted based on the mask information disclosed (provided) from the semiconductor maker MA (product process start schedule, product process result, mask delivery date schedule, mask process start schedule and mask order schedule). This preferential process start display executes sequentially the display of process start and delivery date with preference for all masks listed in the order in addition to the items such as product, mask name, process name, branch number, process start schedule and delivery date schedule or the like. The mask maker MB sequentially starts the processes from the upper side with reference to the preferential process start display.

The left side of lower stage of FIG. 14 illustrates the mask process start re-schedule result connected to product progress result. Here, it is assumed that it will be considered better to start later, with a certain reason, the process of mask enclosed by a thick line in the right side of the upper stage of FIG. 14. In this case, since the mask process start re-schedule result connected to product progress result is fed back on the realtime basis in this embodiment, the preferential process start display after the reschedule becomes the preferential process start display as illustrated in the right side of the lower stage of FIG. 14 and thereby the display can also be updated depending on the schedule. Therefore, the mask maker MB can fabricate effectively the masks and the mask fabrication time can be shortened intensively.

Next, the mask progress fault monitor explained above will be explained with reference to FIGS. 15 to 19.

Figure 15:
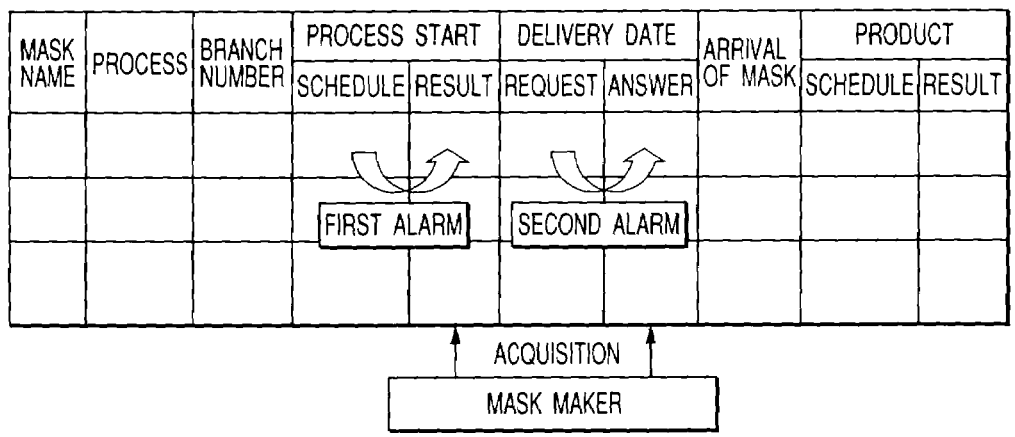
FIG. 15 is an explanatory diagram of a fault monitoring display image of a mask progress fault monitoring method in the method of fabricating semiconductor integrated circuit device as the preferred embodiment of the present invention.

FIG. 15 illustrates an image of a fault monitor display. The fault monitor items include delay of result from the mask process start schedule and delay of answer from the mask delivery date schedule. If a delay is generated, a first alarm and a second alarm are respectively outputted. It is also possible to display the delay on the display by changing the alarm.

Figure 16:
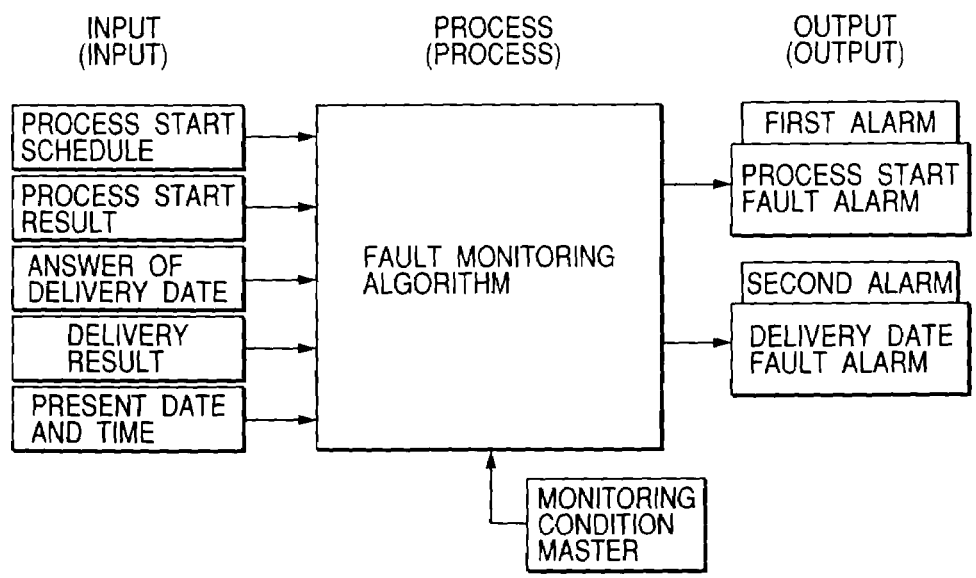
FIG. 16 is an explanatory diagram of a structure of mask progress fault monitoring system in the method of fabricating semiconductor integrated circuit device as the preferred embodiment of the present invention.
Figure 19:
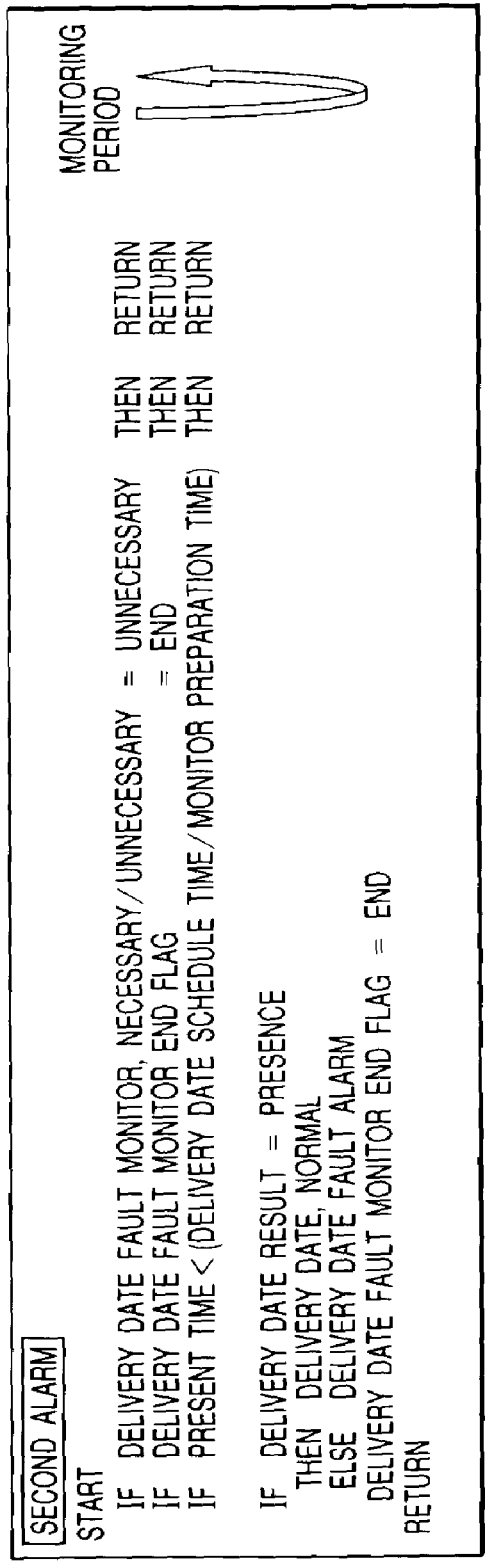
FIG. 19 is an explanatory diagram showing an example of the fault monitoring algorithm used in the mask progress fault monitoring system of FIG. 16.

FIG. 16 illustrates a structure of the fault monitor system. Moreover, FIG. 17 illustrates an example of the monitor condition master. In the monitor condition master, necessity/unnecessity, monitor period and monitor preparation time are set for process start fault and delivery date fault. Moreover, FIG. 18 and FIG. 19 respectively illustrate an example of fault monitor algorithm.

As the input data, the mask process start schedule, mask process start result, mask delivery date schedule, mask delivery date answer and current date and time are indicated. The fault monitor system of this embodiment monitors the mask process start fault and mask delivery date fault using the monitor condition master of FIG. 17 and the fault monitor algorithm of FIG. 18 and FIG. 19 previously registered and outputs the first and second alarms. With these functions, the mask progress fault can be detected on the realtime basis and the mask delivery date obeying coefficient can also be improved.

Next, the mask preparation and mask delivery date management works will be explained with reference to FIG. 20 and FIG. 6.

Figure 20:
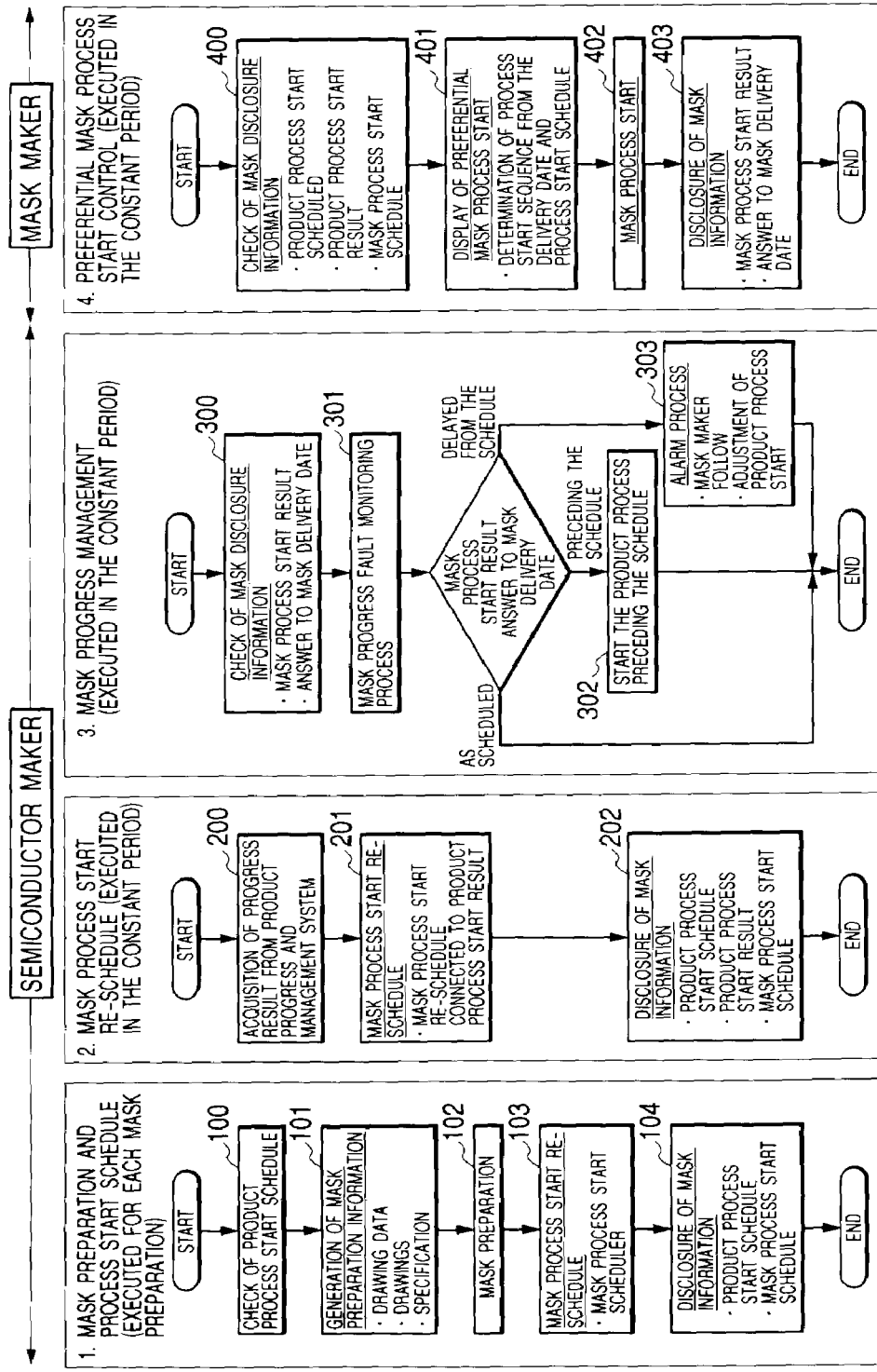
FIGS. 20(1), 20(2), 20(3) and 20(4) are flowcharts of the mask preparation and mask delivery date management work in the method of fabricating semiconductor integrated circuit device as the preferred embodiment of the present invention.

The extreme left side flow of FIG. 20 illustrates a work flow of the mask preparation and process start schedule (executed for every mask preparation). First, after a product process start schedule S1 is confirmed (process 100), mask preparation information S2 is generated (drawing data, drawings, specifications or the like) (process 101) and the masks are prepared using the mask preparation system S3 (process 102). Next, a mask process start schedule is generated using a mask process start scheduler S8 (process 103) and the mask information is disclosed to the mask maker MB (process 104, S10).

The second left flow of FIG. 20 illustrates a work flow of the mask process start re-schedule (executed in every constant period). First, a product progress result is acquired from a product progress management system S11 (process 200) to update the mask process start schedule (mask process start re-schedule connected to the product process start result) (process 201, S8). The schedule result, product process start schedule and result are disclosed as the mask information to the mask maker MB (process 202, S10).

The third left flow of FIG. 20 illustrates a work flow of a mask progress management. The mask disclosure information from the mask maker MB (mask process start result, delivery date answer or the like) are confirmed here (process 300, S16) and the mask progress management fault monitor is executed (process 301, S19). When the process is leading the schedule, the product process is started preceding the schedule (process 302, S11). When the product process is delayed from the schedule, an alarm is issued and the follow-up by the mask maker MB and adjustment for product process start are conducted (process 303, S19).

The extreme right side flow of FIG. 20 illustrates a work flow of the mask preferential process start control (executed in every constant period). After the mask disclosure information from the semiconductor maker MA (mask process start schedule, product process schedule and result, or the like) is confirmed (process 400), a mask preferential process start display (for example, displays are re-arranged in the sequence of the mask process start schedule or mask delivery date) is executed (process 401, S14) and the mask process started in the preferential process start sequence (process 402). Moreover, the result (mask process start result, delivery date answer or the like) is disclosed to the semiconductor maker MA (process 403, S16).

Figure 21:
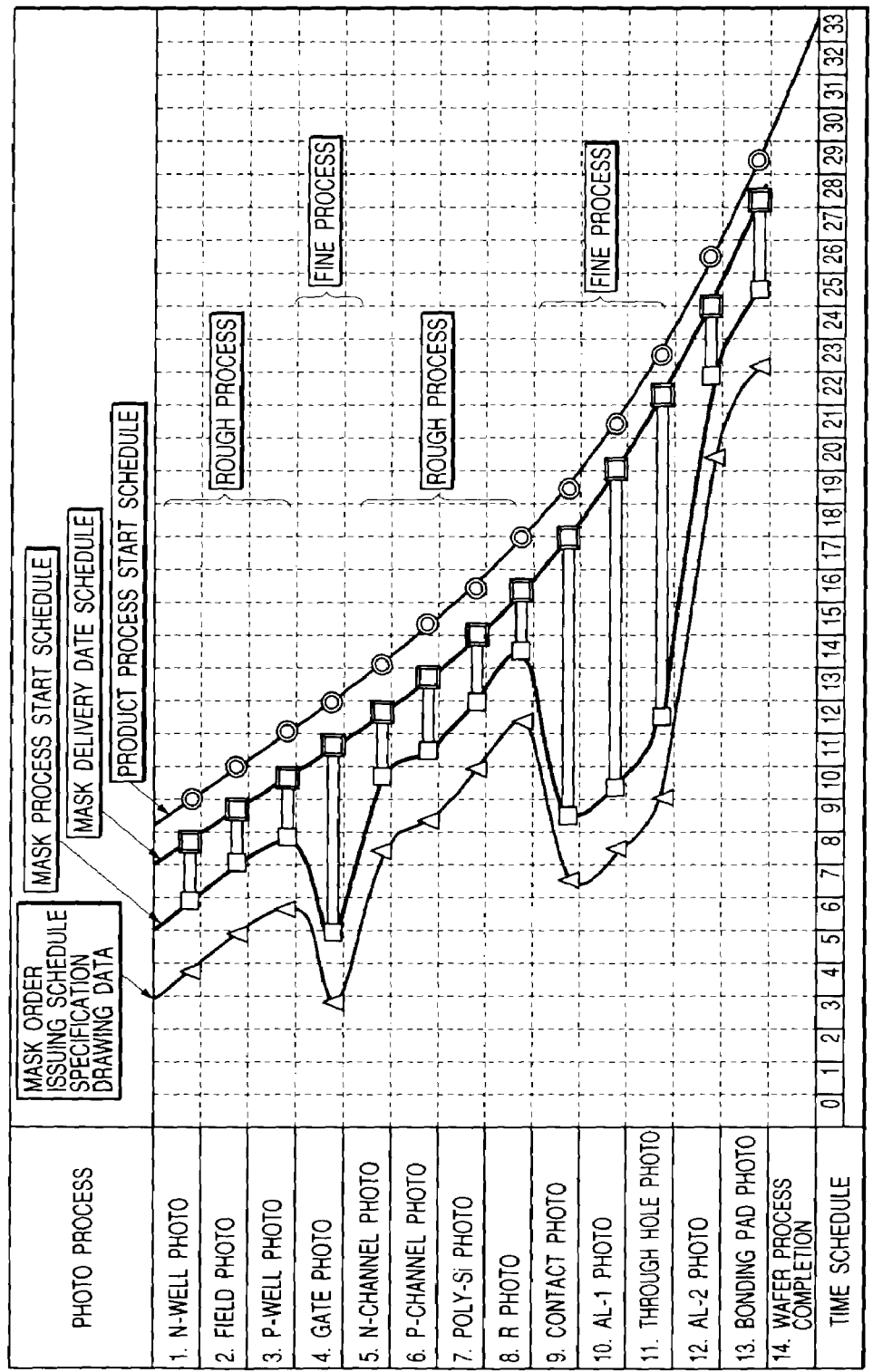
FIG. 21 is an explanatory diagram of a practical example of the mask process start schedule in the method of fabricating semiconductor integrated circuit device as the preferred embodiment of the present invention.

Next, a practical example of the mask process start schedule will be explained. FIG. 21 illustrates a practical example of the mask process start schedule. In FIG. 21, the fabrication processes of semiconductor integrated circuit device are indicated in the vertical direction and the date schedule in the horizontal direction. In this figure, for example, N-well, field, P-well, gate electrode, N-channel, P-channel, polysilicon, resistor, contact, first layer wiring (AL-1), through-hole, second layer wiring (AL-2) and photolithography process of bonding pad are indicated. In parallel to fabrication of semiconductor integrated circuit device by the semiconductor maker, mask used for fabrication of such semiconductor integrated circuit device is fabricated by the mask maker and the fabricated mask is delivered to the semiconductor maker. For example, in the stage where the semiconductor maker executes the exposing process to form N-well, the mask maker fabricates the photomask to form the P-well and gate electrode. As explained above, the semiconductor maker and mask maker advance the fabrication of semiconductor integrated circuit device and mask depending on the mask process start scheduler of FIG. 21. The schedule is divided, for example, to four sequential steps of product process start schedule, mask delivery date schedule, mask process start schedule and mask order schedule (specifications, drawing data or the like) from the right side. When the masks in the rough process and fine process are considered, the mask in the fine process requires more fabrication processes and therefore the mask process is started in advance. Namely, the mask process start is advanced. Accordingly, the leveling in fabrication of mask to be delivered can be realized in a series of fabrication processes of the semiconductor integrated circuit device. In other words, since the mask can be delivered to the semiconductor maker as scheduled, the development period of semiconductor integrated circuit device can be reduced.

Next, a method of fabricating mask in the semiconductor integrated circuit device fabrication method of this embodiment will then be explained.

Figure 22:
FIG. 22 is a cross-sectional view of the essential portion in the photomask fabrication process used in the method of fabricating semiconductor integrated circuit device as the preferred embodiment of the present invention.
Figure 23:
FIG. 23 is a cross-sectional view of the essential portion in the photomask fabrication process following FIG. 22.
Figure 24:
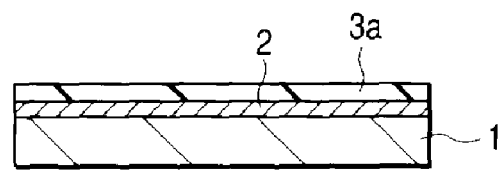
FIG. 24 is a cross-sectional view of the essential portion in the photomask fabrication process following FIG. 23.
Figure 25:
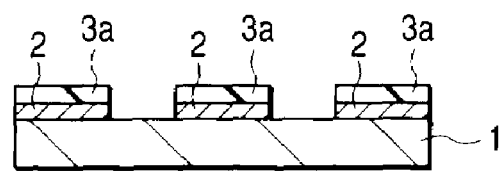
FIG. 25 is a cross-sectional view of the essential portion in the photomask fabrication process following FIG. 24.
Figure 26:
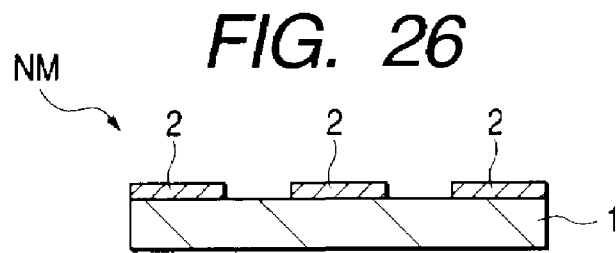
FIG. 26 is a cross-sectional view of the essential portion in the photomask fabrication process following FIG. 25.

FIG. 22 to FIG. 26 respectively illustrate cross-sectional views of the essential portion in the fabrication process of a mask NM used in the rough process. A mask substrate 1 of FIG. 22 is made, for example, of a transparent synthetic quartz glass plate of the like in the thickness of about 6 mm having a flat square surface. First, after the cleaning process is executed to the mask substrate 1, a metal film 2 formed of chromium (Cr) or the like having the light shielding property to the exposing light is deposited, as illustrated in FIG. 23, on the first main surface of this mask substrate 1 with the sputtering method or the like. Moreover, as illustrated in FIG. 24, a photoresist film 3a is coated on the metal film 2 and is then it is baked. Subsequently, after the predetermined pattern is drawn to this photoresist film 3a with a electron beam drawing apparatus, the developing process is executed to form a pattern of the photoresist film 3a on the metal film 2 as illustrated in FIG. 25. Thereafter, using the pattern of photoresist film 3*a* as an etching mask, the metal film 2 exposed from such mask is removed by the etching process to form a light shielding pattern formed of the metal film 2 on the first main surface of the mask substrate 1 as illustrated in FIG. 26. Thereafter, the pattern of photoresist film 3*a* is removed and the cleaning process is executed to the mask substrate 1 to fabricate a mask NM through the external inspection. This mask NM corresponds to an ordinary mask which is used for pattern transfer in the comparatively lower transfer accuracy on the wafer. When the mask NM is formed as a binary mask, it is required to set the transmitting coefficient of the light shielding pattern to almost 0, namely under 1%, preferably to under 0.5% and actually under 0.1%.

Figure 27:
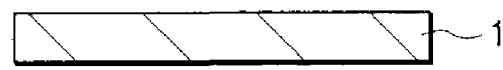
FIG. 27 is a cross-sectional view of the essential portion in the other photomask fabrication process used in the method of fabricating semiconductor integrated circuit device as the preferred embodiment of the present invention.
Figure 28:
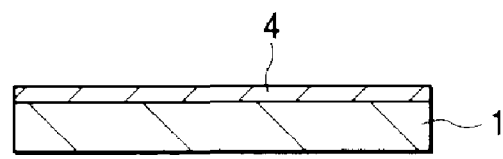
FIG. 28 is a cross-sectional view of the essential portion in the photomask fabrication process following FIG. 27.
Figure 29:
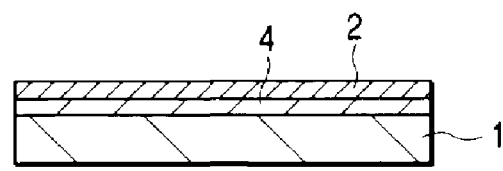
FIG. 29 is a cross-sectional view of the essential portion in the photomask fabrication process following FIG. 28.
Figure 30:
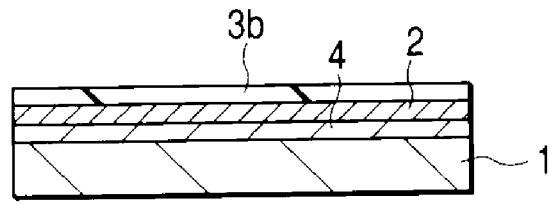
FIG. 30 is a cross-sectional view of the essential portion in the photomask fabrication process following FIG. 29.
Figure 31:
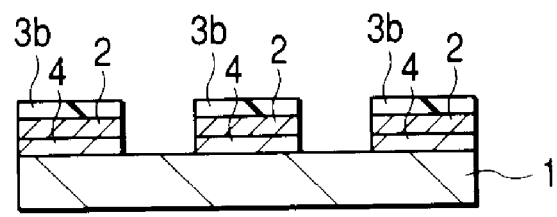
FIG. 31 is a cross-sectional view of the essential portion in the photomask fabrication process following FIG. 30.
Figure 32:
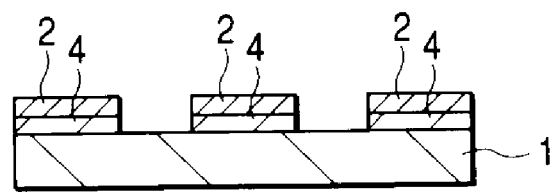
FIG. 32 is a cross-sectional view of the essential portion in the photomask fabrication process following FIG. 31.
Figure 33:
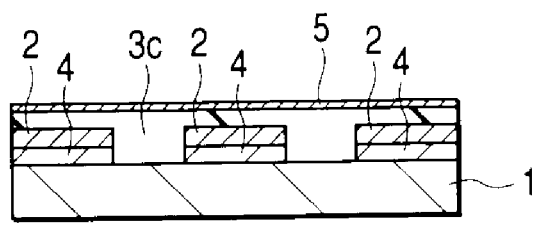
FIG. 33 is a cross-sectional view of the essential portion in the photomask fabrication process following FIG. 32.
Figure 34:
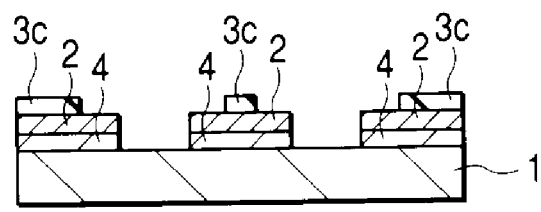
FIG. 34 is a cross-sectional view of the essential portion in the photomask fabrication process following FIG. 33.
Figure 35:
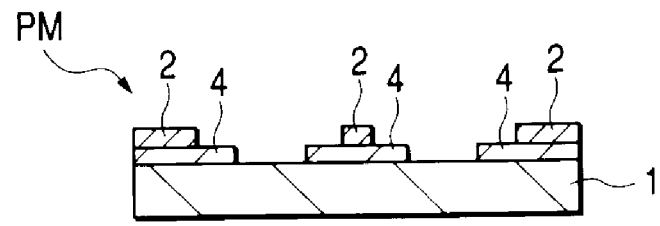
FIG. 35 is a cross-sectional view of the essential portion in the photomask fabrication process following FIG. 34.

Next, FIG. 27 to FIG. 35 respectively illustrate cross-sectional views of the essential portion in the fabrication process of the mask PM used in the fine process. As illustrated in FIG. 27, after the cleaning process is executed to the same kind of mask substrate 1 prepared, a half-tone film 4 made of, for example, molybdenum silicide ($MoSi_2$) or the like is deposited with the sputtering method or CVD (Chemical Vapor Deposition) or the like on the first main surface of the mask substrate 1. Subsequently, as illustrated in FIG. 29, a metal film 2 such as chromium film is deposited with the sputtering method or the like on the halftone film 4. Thereafter, a photoresist film 3*b* is coated thereover and baked as illustrated in FIG. 30. Successively, after the predetermined pattern is drawn to this photoresist film 3*b* with the electron beam drawing apparatus, the pattern is developed to form a pattern of the photoresist film 3*b* over the metal film 2 as illustrated in FIG. 31. Thereafter, using the pattern of the photoresist film 3*b* as an etching mask, the metal film 2 exposed tehrefrom and the half-tone film 4 are removed by the etching process and the photoresist film 3*b* is removed as illustrated in FIG. 32. Thereafter, after the cleaning and external inspection are conducted, a photoresist film 3*c* and a conductive film 5 are sequentially coated from the lower layer on the first main surface of the mask substrate 1 as illustrated in FIG. 33. The conductive film 5 is a transparent film to prevent charging of electrons in the electron beam drawing process to draw a pattern to the photoresist film 3*c*. Thereby, disadvantages such as shape deterioration and displacement fault of photoresist pattern resulting from charging of electron can be controlled or prevented. Next, after the predetermined pattern is drawn on the photoresist film 3*c* with the electron beam drawing apparatus, this film 3*c* is developed to form a pattern of the photoresist film 3*c* on the metal film 2 as illustrated in FIG. 34. Subsequently, using the pattern of photoresist film 3*c* as an etching mask, the metal film 2 exposed from this etching mask is selectively removed by the etching process. Thereafter, the photoresist film 3*c* is removed and the mask PM can be fabricated as illustrated in FIG. 35 through the cleaning and external inspection. This mask PM corresponds to the half-tone type phase shift mask and is used for transfer of pattern in the comparatively higher transfer accuracy on the wafer. On the first main surface of mask substrate 1, a metal film 2 and a half-tone film 4 are formed. The metal film 2 also forms a light shielding pattern as explained above. The half-tone film 4 forms a semi-transparent pattern and also has the function to inversely rotate the phase of the transmitting light for 180 degrees against the light beam having transmitted the transparent region of the mask PM.

Next, the exposing process using a mask fabricated as, explained above will then be explained.

First, after a photoresist film is coated over the surface to be exposed (main surface), namely over the device forming surface of the wafer using, for example, a semiconductor formed of silicon single crystal as the substrate, the wafer is set to a reducing-projection exposing apparatus. Moreover, a fabricated mask is also set to the reducing-projection exposing apparatus. In this case, while the first main surface of the mask, namely the surface where a light shielding pattern or phase shift patter (including the half-tone pattern) is formed is directed toward the reducing-projection lens of the reducing-projection exposing apparatus, namely toward the main surface of wafer, the mask is set. Subsequently, the second main surface of mask (rear surface of the first main surface) is irradiated with the exposing light beam of the reducing-projection exposing apparatus and thereby the photoresist film over the main surface of wafer is irradiated with the exposing light beam having passed the mask via the reducing projection lens the reducing-projection exposing. Thereby, the desired pattern is transferred to the photoresist over the wafer. Moreover, the desired pattern or semiconductor region is formed over the wafer using the photoresist pattern formed through the developing process as the etching mask or ion injection mask.

The present invention has been explained practically on the basis of the preferred embodiments thereof but the present invention is naturally not limited thereto and allows various changes or modifications within the scope of the claims thereof.

For example, in above embodiments, ordinary mask and half-tone mask have been explained but the present invention is not limited thereto and also allows various modifications. For example, the Levenson type phase shift mask and resist mask explained above can also be used.

In above explanation, the present invention has been applied to a method of fabricating semiconductor integrated circuit device which is the application field as the background thereof, but the present invention is not limited thereto and can also be adapted, for example, to fabrication of super-conducting device, micro-machine, magnetic head, electronic device or liquid crystal panel or the like.

Effects of the typical inventions of the present invention among those disclosed in this specification will be explained briefly as follows.

Namely, since mismatching between the fabrication of semiconductor integrated circuit device and supply of mask can be reduced or eliminated by providing a process to execute the matched support using the communication line for fabrication of semiconductor integrated circuit device and fabrication of mask, the development period of semiconductor integrated circuit device can be shortened.

What is claimed is:

1. A method of fabricating a sequence of photomasks, each constructed to perform a different exposure step in manufacture of a semiconductor integrated circuit device, said method comprising the steps of:
    (a) receiving, in a photomask fabrication department, a process start request of the photomasks from a semiconductor integrated circuit device fabrication department via a communication line;
    (b) receiving, in said photomask fabrication department, fabrication schedule information up to delivery from the process start request of the photomasks from said semiconductor integrated circuit device fabrication department via said communication line;
    (c) fabricating, in said photomask fabrication department, only one of each photomask of said sequence of photomasks depending on said process start request and said fabrication schedule information;

(d) providing periodically, from said photomask fabrication department, photomask fabrication progress information to said semiconductor integrated circuit device fabrication department via said communication line;

(e) adjusting, in said semiconductor integrated circuit device fabrication department, fabrication of said sequence of photomasks based on said photomask fabrication progress information, said adjusting including identification of at least one specific photomask of said sequence of photomasks by said semiconductor integrated circuit device fabrication department and changing a fabrication schedule of said at least one specific photomask identified by said semiconductor integrated circuit device fabrication department; and (f) delivering said sequence of photomasks fabricated in said photomask fabrication department to said semiconductor integrated circuit device fabrication department.

2. A method according to claim 1, wherein step (e) comprises the substeps of:

(e1) receiving, in said photomask fabrication department, photomask fabrication schedule information re-generated based on said photomask fabrication progress information via said communication line; and (e2) fabricating, in said photomask fabrication department, said sequence of photomasks depending on said re-generated photomask fabrication schedule information.

3. A method according to claim 1, wherein said photomask fabrication schedule information includes photomask fabrication schedule information for scheduling a future fabrication request to said photomask fabrication department.

4. A method according to claim 1, further comprising the step of:

(g) preferentially fabricating at least one photomask from said sequence of photomasks based on said photomask fabrication schedule information.

5. A method according to claim 1, wherein at least one photomask from said sequence of photomasks is a phase shift mask.

6. A method according to claim 1, wherein the semiconductor integrated circuit device is in a product development stage.

* * * * *